(12) United States Patent
Shin et al.

(10) Patent No.: US 12,532,471 B2
(45) Date of Patent: Jan. 20, 2026

(54) SEMICONDUCTOR DEVICES AND DATA STORAGE SYSTEMS INCLUDING THE SAME

(71) Applicant: SAMSUNG ELECTRONICS CO., LTD., Suwon-si (KR)

(72) Inventors: Subin Shin, Suwon-si (KR); Sangwon Kim, Suwon-si (KR); Jeeyong Kim, Suwon-si (KR); Hyeonjoo Song, Suwon-si (KR); Habin Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 583 days.

(21) Appl. No.: 17/963,320

(22) Filed: Oct. 11, 2022

(65) Prior Publication Data
US 2023/0232628 A1    Jul. 20, 2023

(30) Foreign Application Priority Data

Jan. 20, 2022    (KR) .................. 10-2022-0008548

(51) Int. Cl.
*H10B 43/27* (2023.01)
*H01L 23/528* (2006.01)
(Continued)

(52) U.S. Cl.
CPC ......... *H10B 43/27* (2023.02); *H01L 23/5283* (2013.01); *H10B 41/10* (2023.02);
(Continued)

(58) Field of Classification Search
CPC ........ H10B 43/27; H10B 41/20; H10B 41/27; H10B 41/35; H10B 41/40; H10B 43/10;
(Continued)

(56) References Cited

U.S. PATENT DOCUMENTS

| 10,269,820 | B1 | 4/2019 | Kaminaga |
| 10,325,922 | B2 | 6/2019 | Lim et al. |
| 10,559,585 | B2 | 2/2020 | Kim et al. |
| 10,629,617 | B2 | 4/2020 | Lee |
| 10,720,441 | B2 | 7/2020 | Kam et al. |

(Continued)

FOREIGN PATENT DOCUMENTS

| CN | 112420724 B | 9/2021 |
| CN | 112466885 B | 10/2021 |

(Continued)

*Primary Examiner* — William B Partridge
*Assistant Examiner* — David Paul Sedorook
(74) *Attorney, Agent, or Firm* — Muir Patent Law, PLLC

(57) ABSTRACT

A semiconductor device includes a stack structure having gate electrodes and interlayer insulating layers, the stack structure having a cell region and a step region, and the gate electrodes extending in a first direction to have a step shape in the step region, channel structures through the stack structure in the cell region, separation structures through the stack structure and extending in the first direction, and support structures between the separation structures and through the stack structure in the step region. The step region includes first and second regions, the first region closer to the cell region in the first direction than the second region is, the support structures include first and second support structures through the stack structure in the first and second regions, respectively, a maximum width of the first support structure being greater than that of the second support structure.

20 Claims, 24 Drawing Sheets

(51) Int. Cl.
*H10B 41/10* (2023.01)
*H10B 41/27* (2023.01)
*H10B 41/35* (2023.01)
*H10B 41/40* (2023.01)
*H10B 43/10* (2023.01)
*H10B 43/35* (2023.01)
*H10B 43/40* (2023.01)

(52) U.S. Cl.
CPC ............ *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
CPC ........ H10B 43/35; H10B 43/40; H10B 43/50; H10B 41/50; H01L 23/5283; H01L 27/11582; H01L 27/11519; H01L 27/11524; H01L 27/11526; H01L 27/11556; H01L 27/11565; H01L 27/1157; H01L 27/11573
See application file for complete search history.

(56) References Cited

U.S. PATENT DOCUMENTS

| | | | |
|---|---|---|---|
| 10,777,577 | B2 | 9/2020 | Cheon et al. |
| 10,811,356 | B2 | 10/2020 | Jung et al. |
| 10,825,830 | B2 | 11/2020 | Jung et al. |
| 2005/0151228 | A1 | 7/2005 | Tanida et al. |
| 2016/0071855 | A1* | 3/2016 | Park ........................ H10B 41/35 257/314 |
| 2016/0343727 | A1 | 11/2016 | Kim et al. |
| 2017/0062330 | A1* | 3/2017 | Kim .................... H01L 23/5226 |
| 2019/0378857 | A1* | 12/2019 | Lee ....................... H10D 64/258 |
| 2020/0091187 | A1* | 3/2020 | Lee ........................ H10B 43/50 |
| 2020/0105777 | A1* | 4/2020 | Lin ....................... H10D 64/693 |
| 2021/0050368 | A1 | 2/2021 | Han |
| 2021/0193574 | A1* | 6/2021 | Sun ...................... H01L 21/311 |
| 2022/0181270 | A1* | 6/2022 | Ong ................. H01L 21/76877 |

FOREIGN PATENT DOCUMENTS

| | | |
|---|---|---|
| JP | 2005-167093 A | 6/2005 |
| KR | 10-2015-0071157 A | 6/2015 |
| KR | 1020200032580 A | 3/2020 |
| KR | 1020210143895 A | 11/2021 |

\* cited by examiner

SEMICONDUCTOR DEVICES AND DATA STORAGE SYSTEMS INCLUDING THE SAME

CROSS-REFERENCE TO RELATED APPLICATION

This application claims the benefit under 35 USC 119(a) of Korean Patent Application No. 10-2022-0008548, filed on Jan. 20, 2022, in the Korean Intellectual Property Office, the entire disclosure of which is incorporated herein by reference for all purposes.

BACKGROUND

1. Field

Embodiments relate to a semiconductor device and a data storage system including the same.

2. Description of the Related Art

In a data storage system that requires data storage, a semiconductor device capable of storing high-capacity data is in demand. Accordingly, a method for increasing the data storage capacity of a semiconductor device is being researched. For example, as one of the methods for increasing the data storage capacity of a semiconductor device, a semiconductor device including three-dimensionally arranged memory cells, instead of two-dimensionally arranged memory cells, is proposed.

SUMMARY

According to example embodiments, a semiconductor device includes a stack structure including gate electrodes and interlayer insulating layers alternately stacked on a substrate, the stack structure having a memory cell array region and a step region, and the gate electrodes extending in a first direction to have a step shape in the step region; channel structures passing through the stack structure in the memory cell array region and respectively including a channel layer; separation structures passing through the stack structure and extending in the first direction; and support structures disposed between the separation structures and penetrating through the stack structure in the step region. The step region includes a first region and a second region, the first region being closer to the memory cell array region than the second region in the first direction, the support structures include a first support structure penetrating through the stack structure in the first region and a second support structure penetrating through the stack structure in the second region, the first support structure has a first maximum width and the second support structure has a second maximum width, and the first maximum width is greater than the second maximum width.

According to example embodiments, a semiconductor device includes a stack structure including gate electrodes and interlayer insulating layers alternately stacked on a substrate, the stack structure having a memory cell array region and a step region adjacent to each other in a first direction, and the gate electrodes extending in the first direction, and including pad portions constituting a step shape in the step region; channel structures passing through the stack structure in the memory cell array region and respectively including a channel layer; and support structures passing through the pad portions of the gate electrodes in the step region. The step region includes a first region and a second region, the first region being closer to the memory cell array region than the second region in the first direction, the support structures include first support structures penetrating through first pad portion of the first region among the pad portions, and second support structures penetrating through a second pad portion of the second region among the pad portions, and a first distance between the first support structures adjacent to each other in the first direction is less than a second distance between the second support structures adjacent to each other in the first direction.

According to example embodiments, a data storage system includes a lower structure including a lower substrate and circuit elements on the lower substrate; a semiconductor storage device including an upper structure on the lower structure, and an input/output pad electrically connected to the circuit elements; and a controller electrically connected to the semiconductor storage device through the input/output pad and controlling the semiconductor storage device. The upper structure includes a stack structure including gate electrodes and interlayer insulating layers alternately stacked on a substrate, the stack structure having a memory cell array region and a step region, and the gate electrodes extending in a first direction to have a step shape in the step region; channel structures passing through the stack structure in the memory cell array region and respectively including a channel layer; separation structures passing through the stack structure and extending in the first direction; upper interconnection members disposed on the stack structure and the channel structures, electrically connected to the channel layer, and extending in a second direction, perpendicular to the first direction; and support structures disposed between the separation structures, penetrating through the stack structure in the step region, and electrically isolated from the upper interconnection members. The step region includes a first region and a second region, the first region being closer to the memory cell array region than the second region in the first direction, the support structures include a first support structure penetrating through the stack structure in the first region and a second support structure penetrating through the stack structure in the second region, the first support structure has a first maximum width on a level lower than a level of an upper end of the first support structure, the second support structure having a second maximum width on a level lower than a level of an upper end of the second support structure, and the first maximum width is greater than the second maximum width.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
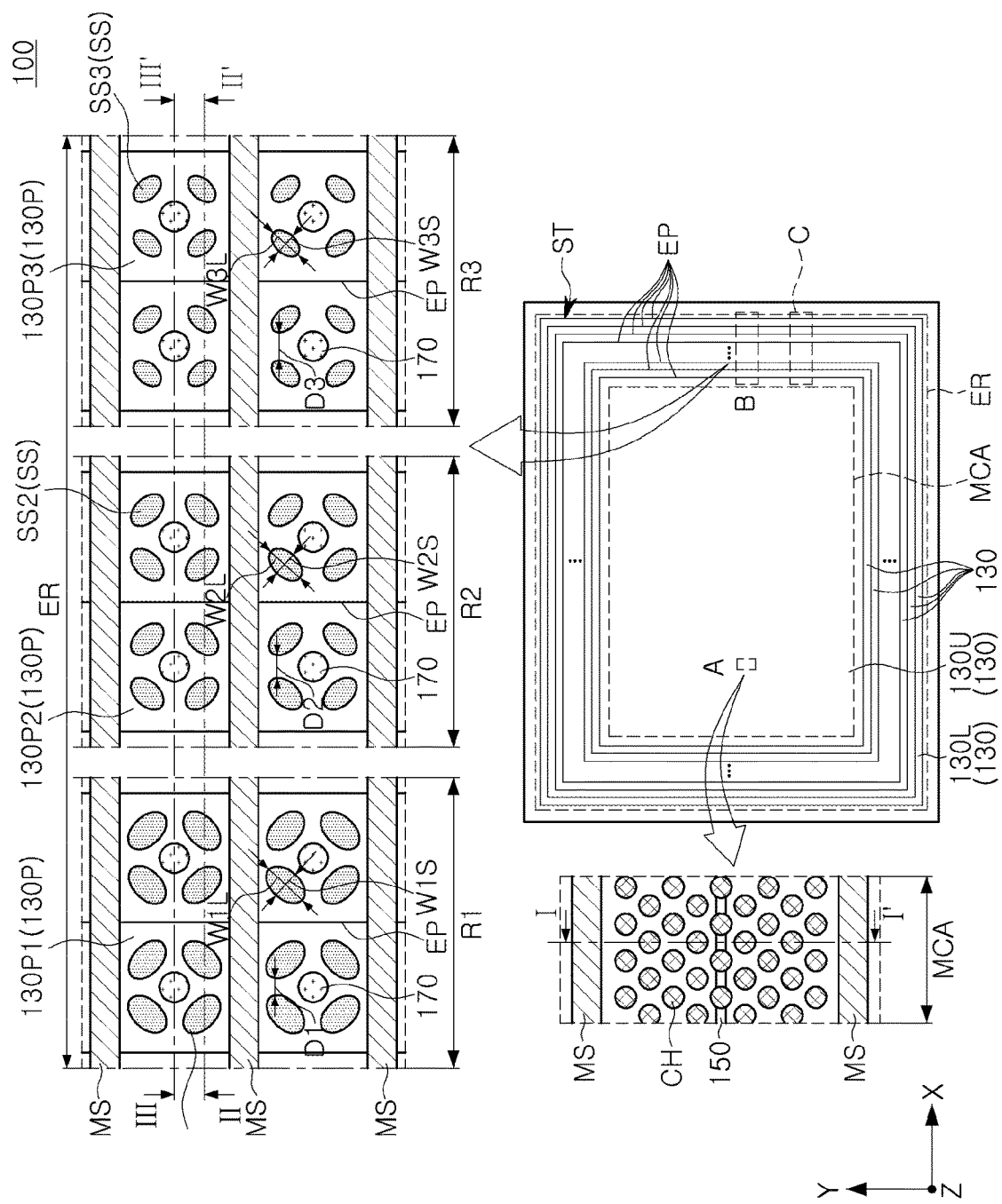
FIG. 1 is a schematic plan view of a semiconductor device according to example embodiments.

FIG. 1 is a schematic plan view of a semiconductor device according to example embodiments. FIG. 1 schematically illustrates the layout of a semiconductor device in a plan view.

Figure 2A:
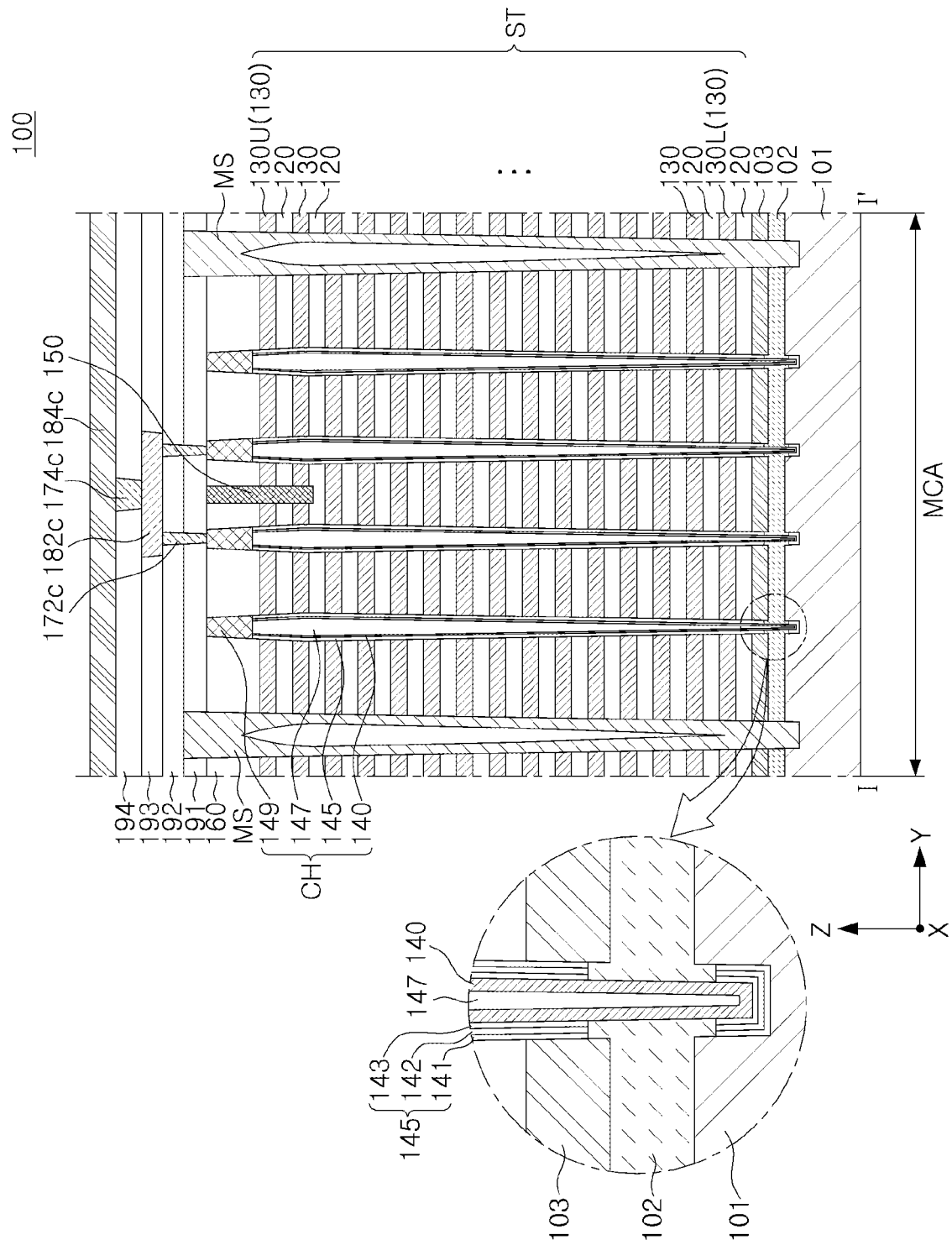
FIGS. 2A, 2B, and 2C are schematic cross-sectional views of a semiconductor device according to example embodiments.
Figure 2B:
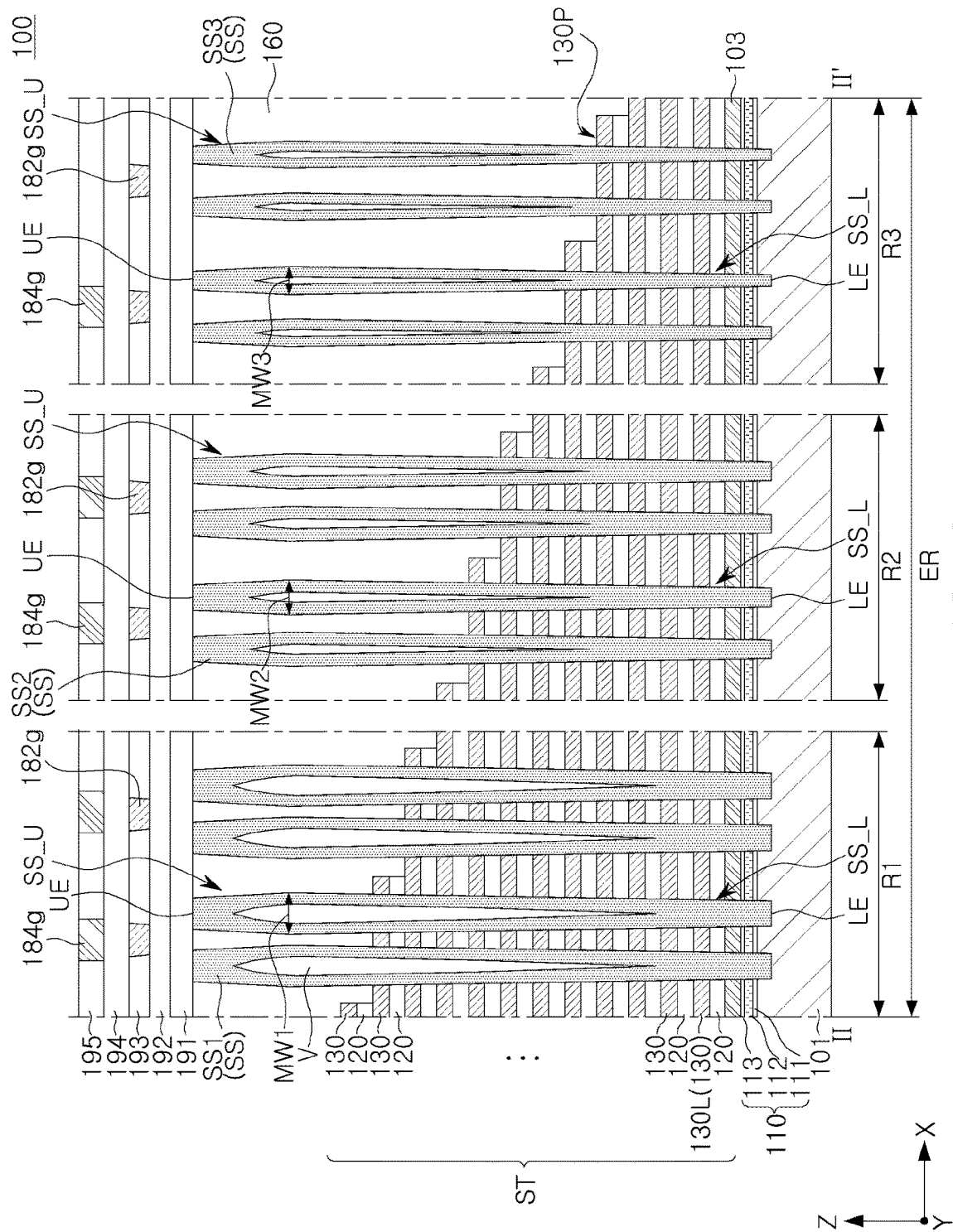
Figure 2C:
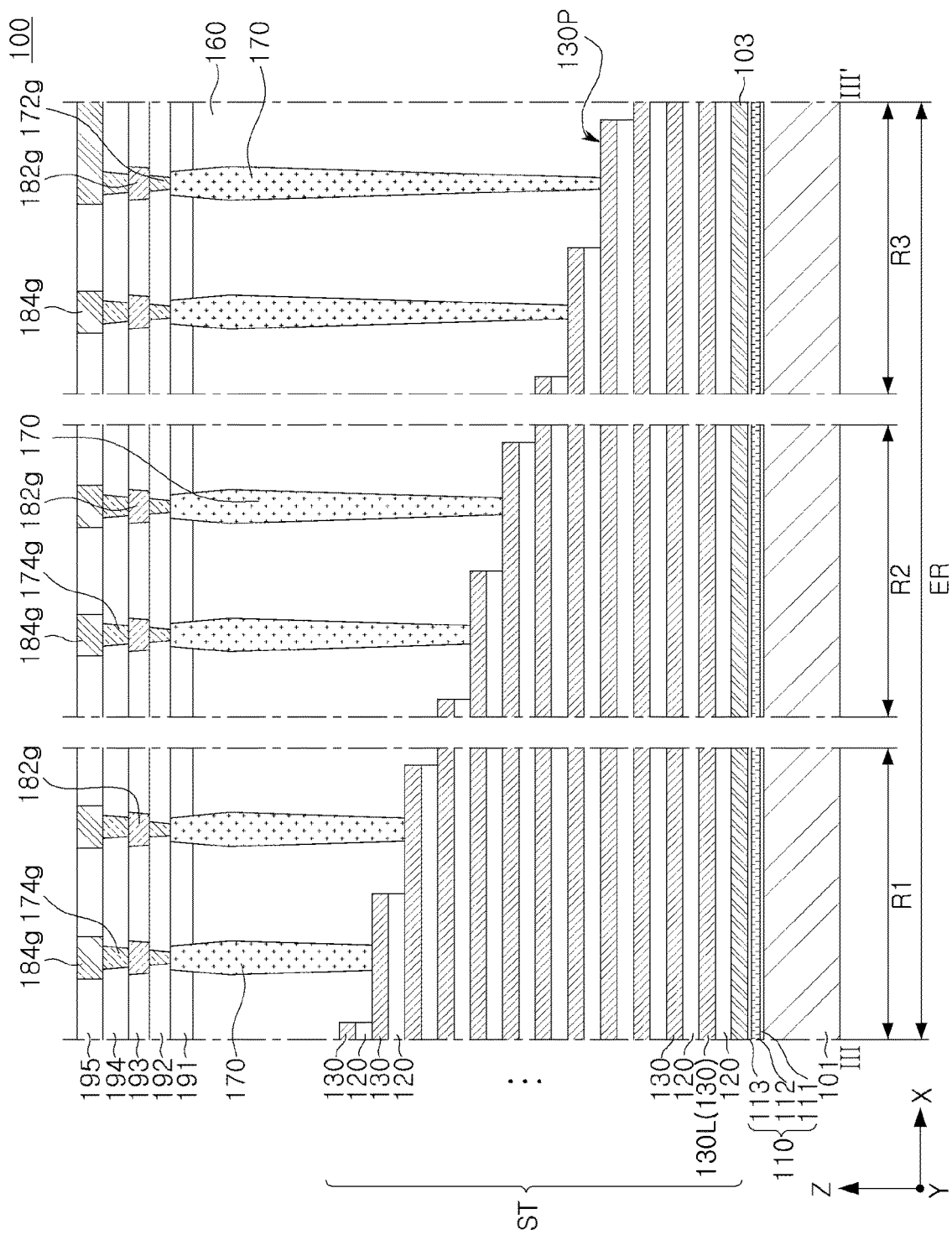

FIGS. 2A, 2B, and 2C are schematic cross-sectional views of a semiconductor device according to example embodiments. FIG. 2A is a cross-sectional view taken along line I-I' of region 'A' of the semiconductor device of FIG. 1, FIG. 2B is a cross-sectional view taken along line II-II' of region 'B' of the semiconductor device of FIG. 1, and FIG. 2C is a cross-sectional view taken along line III-III' of the region 'B' of the semiconductor device of FIG. 1.

Referring to FIGS. 1 to 2C, a semiconductor device 100 may include a substrate 101, a stack structure ST including interlayer insulating layers 120 and gate electrodes 130 alternately stacked on the substrate 101, channel structures CH and support structures SS passing through the stack structure ST, and separation structures MS penetrating through the stack structure ST and extending in one direction. The semiconductor device 100 may include memory cell arrays including the gate electrodes 130 and the channel structures CH.

The substrate 101 may include a semiconductor material, e.g., a group IV semiconductor, a group III-V compound semiconductor, or a group II-VI compound semiconductor. For example, the group IV semiconductor may include silicon (Si), germanium (Ge), or silicon-germanium (SiGe). The substrate 101 may be a single crystal silicon substrate. The substrate 101 may include, e.g., polycrystalline silicon containing impurities. In the substrate 101, a region formed of polycrystalline silicon containing impurities may include a common source region.

The semiconductor device 100 may further include a first conductive layer 102 between the substrate 101 and the stack structure ST, insulating layers 110 disposed at the same level as a level of the first conductive layer 102, and a second conductive layer 103 on the first conductive layer 102 and on the insulating layers 110.

The first conductive layer 102 and the second conductive layer 103 may be stacked on the substrate 101, below a memory cell array region MCA of the stack structure ST. The first conductive layer 102 does not extend between a step region ER of the stack structure ST and the substrate 101, and the second conductive layer 103 may extend between the step region ER of the stack structure ST and the substrate 101. The first conductive layer 102 may function as a portion of a common source line of the semiconductor device 100, e.g., may function as the common source line together with the substrate 101. The substrate 101, the first conductive layer 102, and the second conductive layer 103 may be collectively referred to as a 'source structure.'

As illustrated in the enlarged view of FIG. 2A, the first conductive layer 102 may be directly connected to a channel layer 140, around the channel layer 140. The first conductive layer 102 and the second conductive layer 103 may include a semiconductor material and may include polycrystalline silicon. In this case, at least the first conductive layer 102 may be a doped layer, and the second conductive layer 103 may be a doped layer or may be a layer including impurities diffused from the first conductive layer 102. For example, the first conductive layer 102 and the second conductive layer 103 may include at least one of doped polycrystalline silicon, a metal, and a metal-semiconductor compound. In another example, the second conductive layer 103 may be replaced with an insulating layer.

The insulating layers 110 may include first to third insulating layers 111, 112, and 113 sequentially stacked on the substrate 101, as illustrated in FIG. 2B. The insulating layers 110 may be layers remaining after a portion of the insulating layers 110 are replaced with the first conductive layer 102 in a process of manufacturing the semiconductor device 100. The insulating layers 110 may include, e.g., silicon oxide, silicon nitride, silicon carbide, or silicon oxynitride. The first and third insulating layers 111 and 113 may include an insulating material different from a material of the second insulating layer 112. The first and third insulating layers 111 and 113 may include the same material. For example, the first and third insulating layers 111 and 113 may be formed of the same material as the material of the interlayer insulating layers 120, and the second insulating layer 112 may be formed of the same material as the material of the sacrificial layers 118.

As illustrated in FIG. 1, the stack structure ST may include the memory cell array region MCA and the step region ER surrounding at least one side of the memory cell array region MCA in a plan view. For example, as illustrated in FIG. 1, the step region ER may surround an entire perimeter of the memory cell array region MCA, in a top view.

The memory cell array region MCA may be a region in which the gate electrodes 130 are stacked to be spaced apart from each other in the Z-direction and the channel structures CH are disposed. The memory cell array region MCA may be a partial region of the stack structure ST in which an uppermost gate electrode 130U of the gate electrodes 130 overlaps the stack structure ST in the Z-direction, e.g., in a vertical direction with respect to the upper surface of the substrate 101. For example, the memory cell array region MCA may be a partial region of the stack structure ST in which the inner region between opposing ends EP of the uppermost gate electrode 130U in the X-direction overlaps the stack structure ST in the Z-direction (e.g., as indicated by the innermost dashed frame in FIG. 1).

The step region ER may be an area in which the gate electrodes 130 extend in a step shape, e.g., have a cross-section shaped as stairs. As illustrated in FIG. 1, the step region ER may be disposed to surround the memory cell array region MCA in a plan view. The step region ER may be an area in which the step-shaped gate electrodes 130 provide pad portions 130P to be connected to gate contact plugs 170. The pad portions 130P may have a step shape. In a partial region (e.g., an area 'C') of the step region ER, a through-interconnection region (e.g., 'TR' in FIG. 4A or 4B) for electrically connecting the gate contact plugs 170 to circuit elements 20 of a lower structure 1 may be provided.

The gate electrodes 130 may be stacked to be spaced apart from each other in the Z-direction on the substrate 101 in the memory cell array region MCA. The gate electrodes 130 may be separated by the separation structures MS to extend in the X-direction. The gate electrodes 130 may include lower gate electrodes 130L constituting the gate of the ground selection transistor, memory gate electrodes constituting a plurality of memory cells, and upper gate electrodes 130U forming gates of string select transistors. The storage capacity of the semiconductor device 100 may be determined according to the number of the memory gate electrodes constituting the memory cells. In example embodiments, the gate electrodes 130 may further include a gate electrode disposed above the upper gate electrodes and/or below the lower gate electrodes to form an erase transistor used in an erase operation using a gate induced drain leakage (GIDL) phenomenon.

The gate electrodes 130 may extend to have different lengths in the X-direction to form a stepped structure in the form of a step. Due to the stepped structure, a lower gate electrode of the gate electrodes 130 (i.e., a gate electrode closer to the substrate 101) may extend longer in the X-direction than an upper gate electrode (i.e., a gate electrode farther from the substrate 101) to have pad portions 130P exposed (i.e., on a portion of the lower gate electrode that extends beyond the upper gate electrode). The stepped structure of the gate electrodes 130 is not particularly limited. For example, the gate electrodes 130 may form a stepped structure in the X-direction and may also form a stepped structure in the Y-direction, between a pair of separation structures MS.

The gate electrodes 130 may be disposed to be separated from each other in the Y-direction by the separation structure MS extending in the X-direction. The gate electrodes 130 between the pair of separation structures MS may form one memory block, and the range of the memory block is not limited thereto. The gate electrodes 130 may each include a first layer and a second layer. The first layer may cover upper and lower surfaces of the second layer and may extend between the channel structure CH and the second layer. The first layer may include a high-κ material, e.g., aluminum oxide (AlO), and the second layer may include at least one of titanium (Ti), titanium nitride (TiN), tantalum (Ta), tantalum nitride (TaN), tungsten (W), and tungsten nitride (WN). According to an example embodiment, the gate electrodes 130 may include, e.g., polycrystalline silicon or a metal-semiconductor compound.

The interlayer insulating layers 120 may be disposed between the gate electrodes 130 in the memory cell array region MCA. Like the gate electrodes 130, the interlayer insulating layers 120 may be stacked to be spaced apart from each other in the vertical direction Z, and may extend in the X-direction. The interlayer insulating layers 120 may include an insulating material, e.g., silicon oxide, silicon nitride, or silicon oxynitride. Some of the interlayer insulating layers 120 may have different thicknesses.

As illustrated in FIG. 1, the channel structures CH respectively may include one memory cell string and may be disposed to be spaced apart from each other while forming rows and columns in the memory cell area MCA. The channel structures CH may be disposed to form a grid pattern or may be disposed in a zigzag shape in one direction. The channel structures CH may have a columnar shape, and may have inclined side surfaces that are narrower in width toward the substrate 101 according to an aspect ratio.

The channel layer 140 may be disposed in the channel structures CH. For example, in the channel structures CH, the channel layer 140 may be formed in an annular shape surrounding the inner core insulating layer 147. In another example, the channel layer 140 may have a columnar shape, e.g., a cylinder or a prism without the core insulating layer 147. A lower portion of the channel layer 140 may be connected to the first conductive layer 102. The channel layer 140 may include a semiconductor material, e.g., polycrystalline silicon or single crystal silicon.

A channel pad 149 may be disposed on the channel layer 140 in the channel structure CH. The channel pad 149 may be disposed to cover the upper surface of the core insulating layer 147, and may be electrically connected to the channel layer 140. The channel pad 149 may include, e.g., doped polycrystalline silicon. The channel pad 149 may include a semiconductor material, e.g., polycrystalline silicon, monocrystalline silicon, and/or doped polycrystalline silicon.

A gate dielectric layer 145 may be disposed between the gate electrodes 130 and the channel layer 140. As illustrated in the enlarged view of FIG. 2A, the gate dielectric layer 145 may include a tunneling layer 143, an information storage layer 142, and a blocking layer 141 sequentially stacked from the channel layer 140. The tunneling layer 143 may tunnel charges to the information storage layer 142, and may include, e.g., silicon oxide (SiO), silicon nitride (SiN), silicon oxynitride (SiON), or combinations thereof. The information storage layer 142 may be a charge trap layer or a floating gate conductive layer. The blocking layer 141 may include, e.g., silicon oxide (SiO), silicon nitride (SiN), silicon oxynitride (SiON), a high-K dielectric material, or combinations thereof.

As illustrated in FIG. 1, the support structures SS may be disposed between the separation structures MS, as viewed in a top view. The support structures SS may pass through the pad portions 130P of the gate electrodes 130 in the step region ER. As illustrated in FIG. 2B, the support structures SS may, e.g., continuously, pass through the stack structure ST. The support structures SS may, e.g., continuously, penetrate through the second conductive layer 103 and the insulating layers 110, and lower ends thereof may, e.g., directly, contact the substrate 101. The support structures SS may be disposed to be spaced apart from each other while forming rows and columns, similar to the channel structures CH, and may be disposed to form a grid pattern or may be disposed in a zigzag form in one direction, e.g., in a top view (FIG. 1). The support structures SS may have a structure different from that of the channel structures CH (e.g., may have a different cross-sectional shape, different layers therein, different materials therein, different functionality, etc.), and may not perform a substantial function during operation of the semiconductor device 100, e.g., the support structures SS may not be electrically connected to the substrate 101 or any electrical elements. The upper ends of the support structures SS may be disposed on levels different form the upper ends of the channel structures CH.

The support structures SS may be dummy structures, and some of the channel structures CH disposed adjacent to the step region ER may be dummy channel structures. The support structures SS may include an insulating material, e.g., at least one of silicon oxide, silicon nitride, and silicon oxynitride. A seam or a void may be included in the insulating layer constituting the support structures SS.

At least one support structure SS of the support structures SS may include a lower region SS_L and an upper region SS_U. The lower region SS_L is a region in which the width, e.g., in the X-direction, of the at least one support structure SS increases from a lower end LE of the at least one support structure SS toward the upper region SS_U. The upper region SS_U is a region in which the width, e.g., in the X-direction, of the at least one support structure SS increases from an upper end UE of the at least one support structure SS toward the lower region SS_L. For example, referring to FIG. 2B, the lower region SS_L and the upper region SS_U have increased widths in opposite directions, e.g., toward each other, such that a maximum width of the at least one support structure SS may be spaced apart from and between the lower end LE and the upper end UE. The at least one support structure SS may have the maximum width at a level lower than each of the upper ends UE. As used herein, the term 'maximum width' indicates a maximum width of a corresponding component along a horizontal direction, e.g., the X-direction and/or the Y-direction, in a vertical cross-sectional view.

The support structures SS may prevent the stack structure ST from being inclined or from collapsing, thereby improving structural stability of the stack structure ST. To improve the structural stability of the stack structure ST, the support structures SS may have different structures according to regions R1, R2, and R3 of the step region ER. For example, the maximum widths of the support structures SS may vary according to the regions R1, R2, and R3 of the step region ER.

When the step region ER is divided into a first region R1, a second region R2 and a third region R3 in the order closest to the memory cell array region MCA, the support structures SS may include first support structures SS1 passing through the stack structure ST in the first region R1, second support structures SS2 passing through the stack structure ST in the second region R2, and third support structures SS3 passing through the stack structure ST in the third region R3. The first region R1 may be closer to the memory cell array region MCA than the second region R2 in the X-direction, and the second region R2 may be closer to the memory cell array region MCA than the third region R3 in the X-direction. For example, referring to FIGS. 1 and 2B, the first through third regions R1 to R3 may be arranged sequentially from the memory cell array region MCA, e.g., in a direction oriented radially away from the memory cell array region MCA. For example, referring to FIG. 1, each of the first through third regions R1 to R3 may surround the memory cell array region MCA in a top view.

As illustrate in FIG. 2B, a first maximum width MW1 of at least one of the first support structures SS1 may be greater than a second maximum width MW2 of at least one of the second support structures SS2, and the second maximum width MW2 of at least one of the second support structures SS2 may be greater than a third maximum width MW3 of at least one of the third support structures SS3. The respective maximum widths MW1, MW2, and MW3 of the first to third support structures SS1, SS2, and SS3 may be measured at a level lower than the respective upper ends UE. In an example, the first maximum width MW1 may be greater than the third maximum width MW3 by about 10% to about 25% of the third maximum width MW3, and the second maximum width MW2 may be greater than the third maximum width MW3 by about 2% to about 15% of the third maximum width MW3.

In another example, each of the first maximum width MW1 and the second maximum width MW2 may be greater than the third maximum width MW3, and the first maximum width MW1 and the second maximum width MW2 may be substantially equal to each other. In another example, the first maximum width MW1 may be greater than each of the second maximum width MW2 and the third maximum width MW3, and the second maximum width MW2 and the third maximum width MW3 may be substantially equal to each other.

The first support structures SS1 may penetrate through a first pad portion 130P1 of the first region R1, the second support structures SS2 may penetrate through a second pad portion 130P2 of the second region R2, and the third support structures SS3 may penetrate through a third pad portion 130P3 of the third region R3. As illustrated in the enlarged view of FIG. 1, a first distance D1 between the first support structures SS1 adjacent in the X-direction may be less than a second distance D2 between the second support structures SS2 adjacent in the X-direction. Also, the second distance D2 may be less than a third distance D3 between the second support structures SS3 adjacent in the X-direction. As illustrated in FIG. 2B, the lower end of the first void V formed inside the first support structure SS1 may be located at a level lower than the lower end of the second void formed inside the second support structure SS2, and the lower end of the second void may be located at a level lower than the lower end of the third void formed inside the third support structure SS3.

As illustrated in the enlarged view of FIG. 1, each of the support structures SS may have an elliptical or bar-shaped upper surface having a major axis and a minor axis, e.g., in a top view. At least one of the first support structures SS1 may have a first width W1L in the major axis direction, at least one of the second support structures SS2 may have a second width W2L in the major axis direction, and at least one of the third support structures SS3 may have a third width W3L in the major axis direction. The first width W1L may be greater than the second width W2L. The second width W2L may be greater than the third width W3L. At least one of the first support structures SS1 may have a first width W1S in the minor axis direction, at least one of the second support structures SS2 may have a second width W2S in the minor axis direction, and at least one of the third support structures SS3 may have a third width W3S in the minor axis direction. The first width W1S may be greater than the second width W2S. The second width W2S may be greater than the third width W3S.

The number of gate electrodes 130 through which the first support structures SS1 pass may be greater than the number of gate electrodes 130 through which the second support structures SS2 pass. The number of gate electrodes 130 through which the second support structures SS2 pass may be greater than the number of gate electrodes 130 through which the third support structures SS3 pass. In the step region ER of the stack structure ST, the number of gate electrodes 130 stacked in the first region R1 is greater than the number of gate electrodes 130 stacked in the second region R2, and the number of gate electrodes 130 stacked in the second region R2 is greater than the number of gate electrodes 130 stacked in the third region R3.

In general, structural stability of the stack structure ST may decrease from the third region R3 toward the first region R1, e.g., due to increased number of stacked gate electrodes 130. Further, when the conductive material constituting the gate electrodes 130, e.g., tungsten (W), shrinks, the stack structure may be physically weaker in the first region R1 than in the third region R3.

However, according to an example embodiment, since the sizes of the first to third support structures SS1, SS2, and SS3 increase from the third region R3 toward the first region R1, the volume occupied by the gate electrodes 130 in the stack structure ST of the first region R1 may be reduced. As such, the physical vulnerability of the stack structure ST may be reduced.

The separation structure MS may be disposed to penetrate through the stack structure ST in the Z-direction and extend in the X-direction. The separation structure MS may include a plurality of separation structures MS that are disposed side by side in the Y-direction. The separation structures MS may separate the gate electrodes 130 from each other in the Y-direction. Based on the upper surface of the substrate 101, the level of the upper surface of the separation structure MS may be higher than the level of upper ends of the channel structures CH, and may be higher than the level of upper ends of the support structures SS. The separation structure MS may vertically penetrate through the entire stacked gate electrodes 130 and contact the substrate 101. The separation structure MS may have a shape in which a width decreases as it approaches the substrate 101 due to a high aspect ratio. The separation structures MS may include an insulating material, e.g., at least one of silicon oxide, silicon nitride, and silicon oxynitride. A seam or a void may be included in the insulating layer constituting the separation structures MS.

As illustrated in FIGS. 2A-2C, the semiconductor device 100 may further include an upper separation structure 150, an upper capping layer 160, first upper contacts 172c and 172g, first interconnection members 182c and 182g, second upper contacts 174c and 174g, second interconnection members 184c and 184g, and upper insulating layers 191, 192, 193, 194 and 195.

The upper separation structure 150 may extend in the X-direction between the separation structures MS. The upper separation structure 150 may separate the upper gate electrodes 130 including the uppermost gate electrodes 130U from each other in the Y-direction. For example, the upper separation structure 150 may penetrate through the uppermost gate electrode 130U and the next highest upper gate electrode 130 disposed therebelow. The number of gate electrodes 130 separated by the upper separation structure 150 may be variously changed in example embodiments. The upper gate electrodes 130 separated by the upper separation structure 150 may form different string selection lines in the semiconductor device 100. The upper separation structure 150 may include an insulating material, e.g., silicon oxide, silicon nitride, or silicon oxynitride.

The upper capping layer 160 may be disposed on the stack structure ST, to partially cover respective side surfaces of the channel structures CH, the support structures SS, the separation structure MS, and the upper separation structure 150. The upper surface of the upper capping layer 160 may be substantially coplanar with the upper surface of the channel structure CH and the upper surface of the support structure SS. The upper capping layer 160 may be formed of, e.g., silicon oxide, silicon nitride, silicon oxynitride, or silicon oxycarbide.

The first upper contacts 172c and 172g may be disposed on the stack structure ST. The first upper contacts 172c and 172g may include first channel contacts 172c and first gate contacts 172g. The first channel contacts 172c may be connected to the channel structures CH. The first gate contacts 172g may be connected to the gate contact plugs 170, and in the step region ER, may be electrically connected to the pad portions 130P of the gate electrodes 130.

The second upper contacts 174c and 174g may be disposed on the first interconnection members 182c and 184g, and may include second channel contacts 174c and second gate contacts 174g. The second channel contacts 174c may be connected to the first channel interconnection members 182c. The second gate contacts 174g may be connected to the first gate lines 184g.

The first interconnection members 182c and 184g may be disposed on the first upper contacts 172c and 172g. The first interconnection members 182c and 184g may include first channel interconnection members 182c and first gate interconnection members 182g. The first channel interconnection members 182c may be connected to the first channel contacts 172c. The first gate interconnection members 182g may be connected to the first gate contacts 172g.

The second interconnection members 184c and 184g may be disposed on the second upper contacts 174c and 174g. The second interconnection members 184c and 184g may extend in the Y-direction. The second interconnection members 184c and 184g may include second channel interconnection members 184c and second gate interconnection members 184g. The second channel interconnection members 184c may be connected to the second channel contacts 174c. The second gate interconnection members 184g may be connected to the second gate contacts 174g.

The upper contacts 172c, 172g, 174c, and 174g and the upper interconnection members 182c, 182g, 184c, and 184g may form an upper interconnection structure. The upper interconnection structure may be electrically isolated from the support structures SS. Each component constituting the upper interconnection structure may include a conductive layer and a barrier layer covering the lower surface and side surfaces of the conductive layer. The barrier layer may include at least one of, e.g., titanium (Ti), titanium nitride (TiN), tantalum (Ta), tantalum nitride (TaN), tungsten nitride (WN), and tungsten carbon nitride (WCN). The conductive layer may include a conductive material, e.g., at least one of tungsten (W), copper (Cu), and aluminum (Al). The arrangement and/or the number of contacts and interconnection members constituting the upper interconnection structure may be variously changed according to example embodiments.

The upper insulating layers 191, 192, 193, 194, and 195 may be disposed on the upper capping layer 160, and may include a first upper insulating layer 191, a second upper insulating layer 192, a third upper insulating layer 193, a fourth upper insulating layer 194, and a fifth upper insulating layer 195 sequentially stacked. Each of the upper insulating layers 191, 192, 193, 194, and 195 may be formed of, e.g., silicon oxide, silicon nitride, silicon oxynitride, or silicon oxycarbide.

Figure 3A:
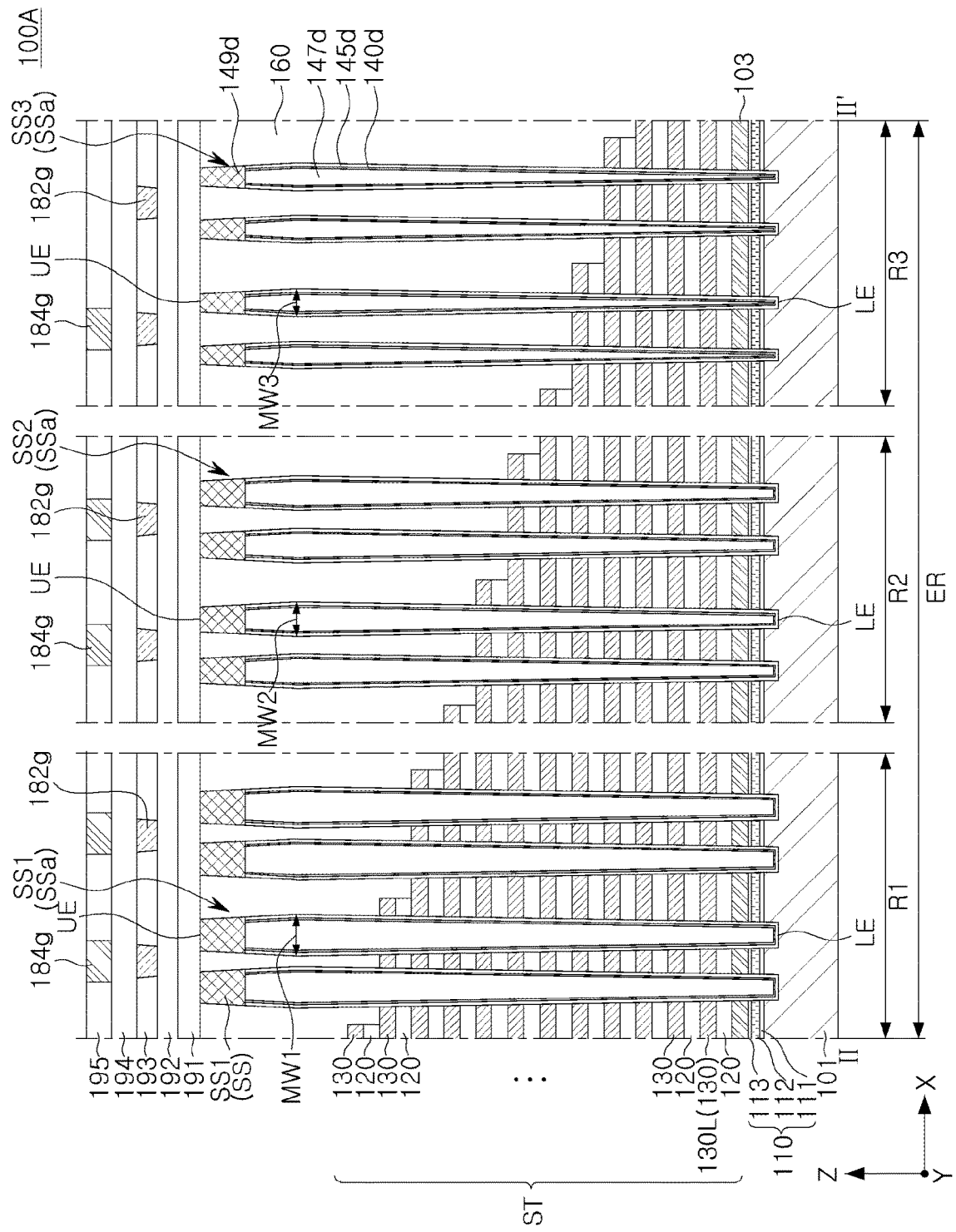
FIGS. 3A and 3B are schematic cross-sectional views of semiconductor devices according to example embodiments.
Figure 3B:
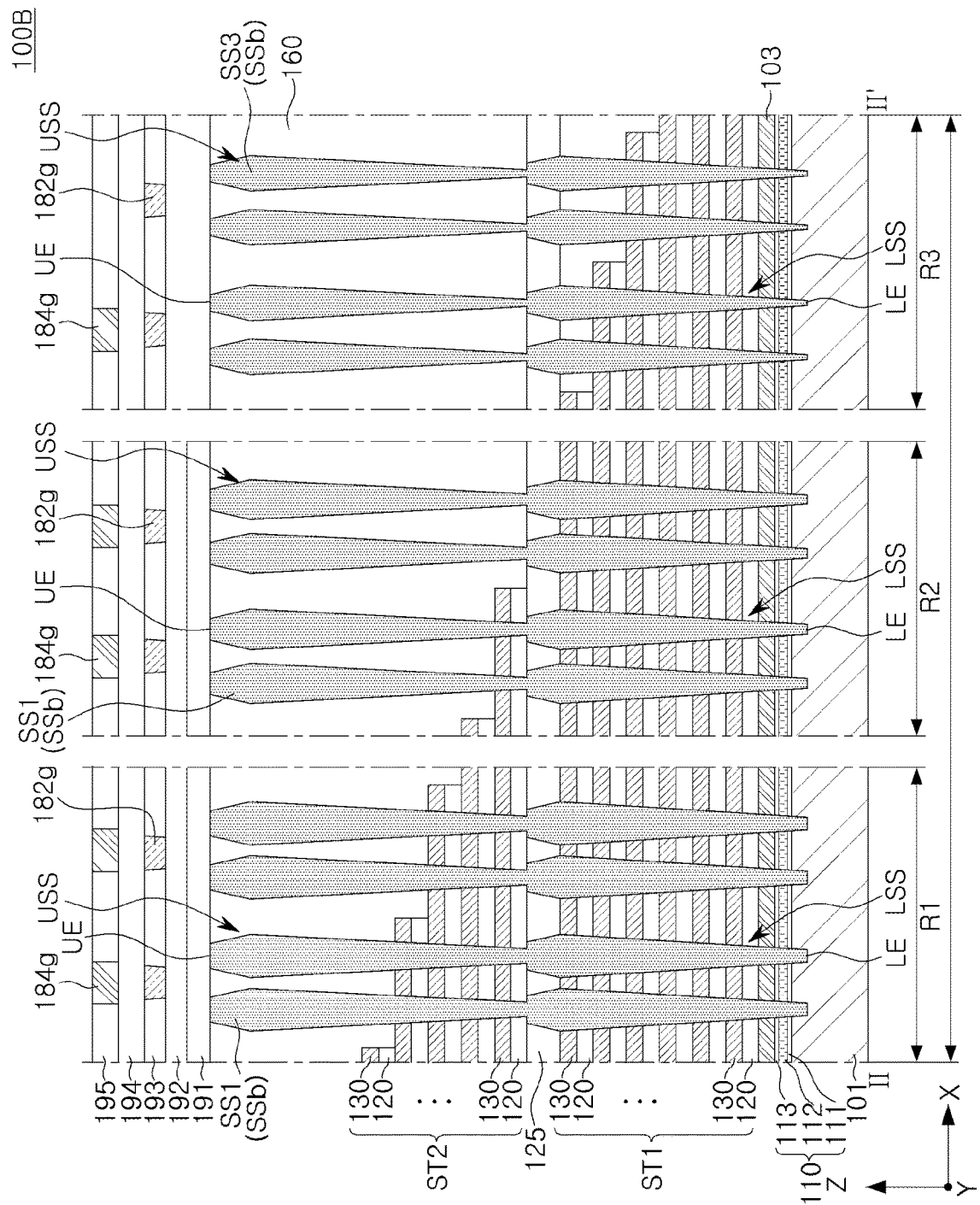

FIGS. 3A and 3B are schematic cross-sectional views of semiconductor devices according to example embodiments.

Referring to FIG. 3A, each of support structures SSa of a semiconductor device 100A may include a dummy gate dielectric layer 145d, a dummy channel layer 140d, a dummy core insulating layer 147d, and a dummy channel pad 149d, corresponding to the gate dielectric layer 145, the channel layer 140, the core insulating layer 147, and the channel pad 149 of the channel structures CH. The support structures SSa may be formed in the same process as the channel structures CH. Similar to the gate dielectric layer 145, the dummy gate dielectric layer 145d may include a plurality of layers. However, the support structures SSa may pass through the stack structure ST in the step region ER, be spaced apart from the first conductive layer 102, and penetrate through the insulating layers 110. In detail, the dummy channel layer 140d of the support structures SSa may not be electrically connected to the substrate 101.

Referring to FIG. 3B, a stack structure of a semiconductor device 100B may include a lower stack structure ST1 and an upper stack structure ST2, and may further include an intermediate layer 125 between the lower stack structure ST1 and the upper stack structure ST2. Each of support structures SSb may include a lower support pattern LSS and an upper support pattern USS. The lower support pattern LSS may penetrate through the lower stack structure ST1, and the upper support pattern USS may penetrate through the upper stack structure ST2. The width of the upper end of the lower support pattern LSS may be greater than the width of the lower end of the upper support pattern USS. The support structure SSb may include a bent portion due to a difference in width at a level between the lower stack structure ST1 and the upper stack structure ST2. The lower support pattern LS S may have a maximum width at a level lower than the upper end of the lower support pattern LSS, and the upper support pattern USS may have a maximum width at a level lower than an upper end of the upper support pattern USS.

Figure 4A:
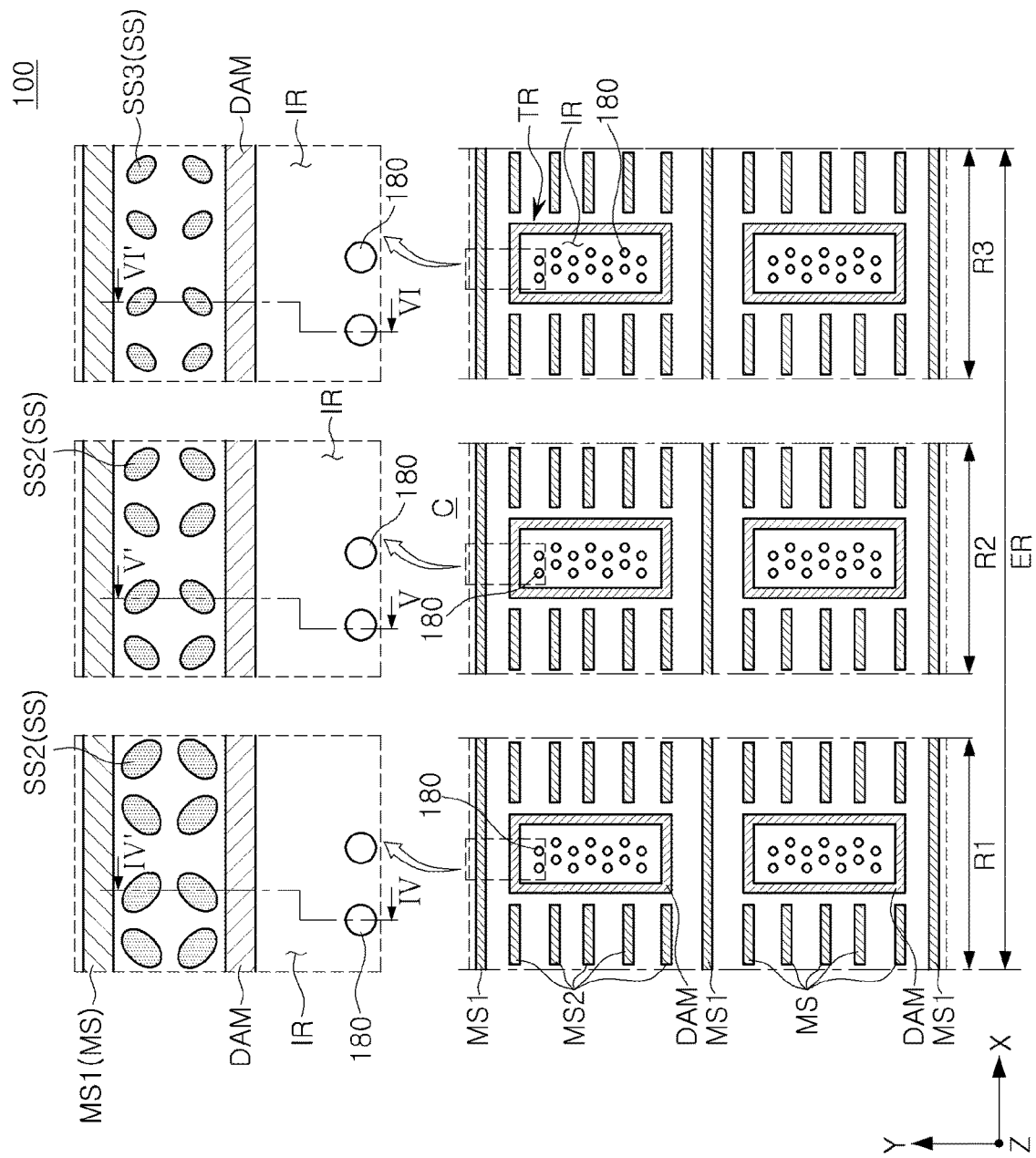
FIGS. 4A and 4B are schematic plan views of a semiconductor device according to example embodiments.
Figure 4B:
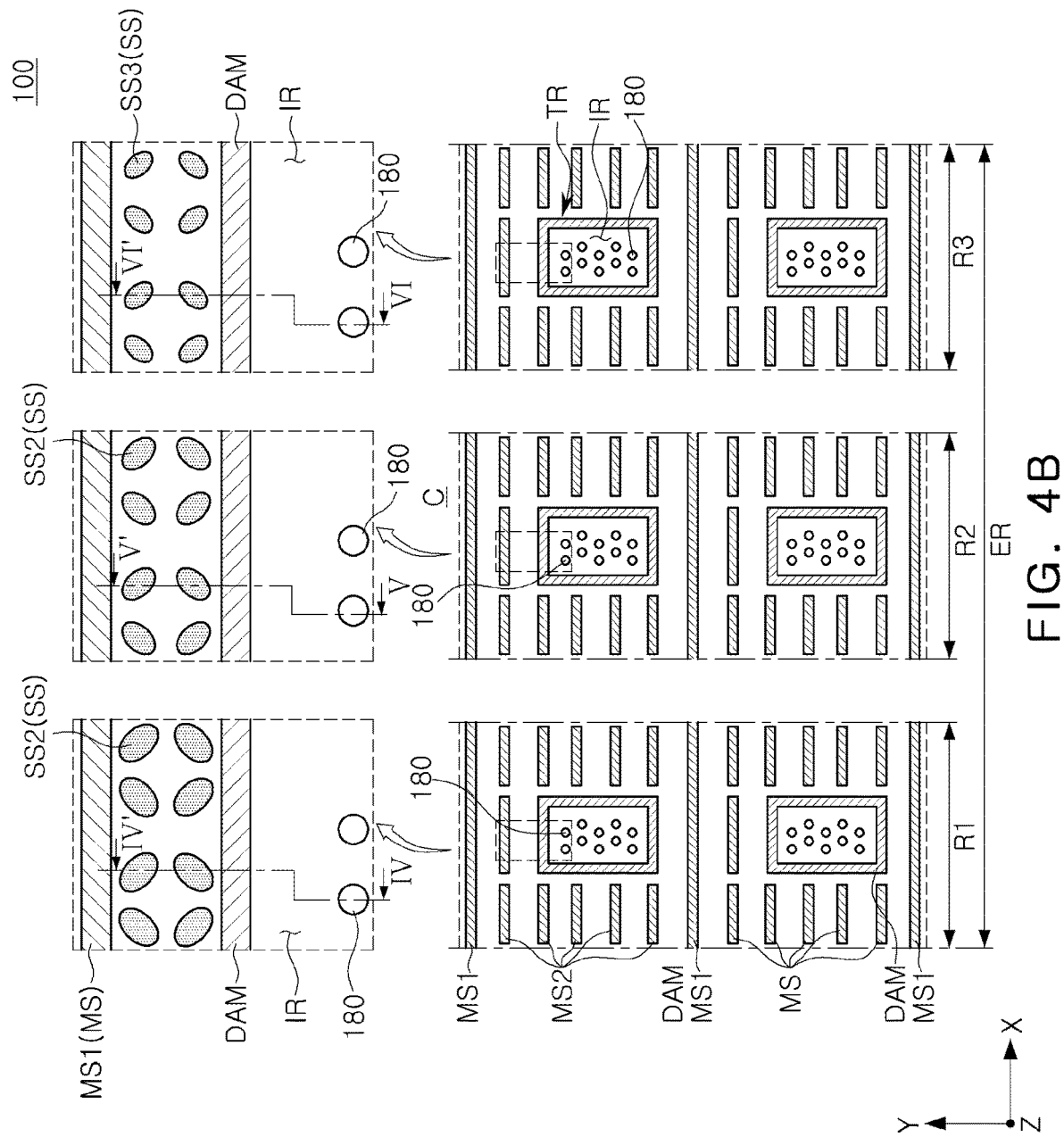
Figure 4C:
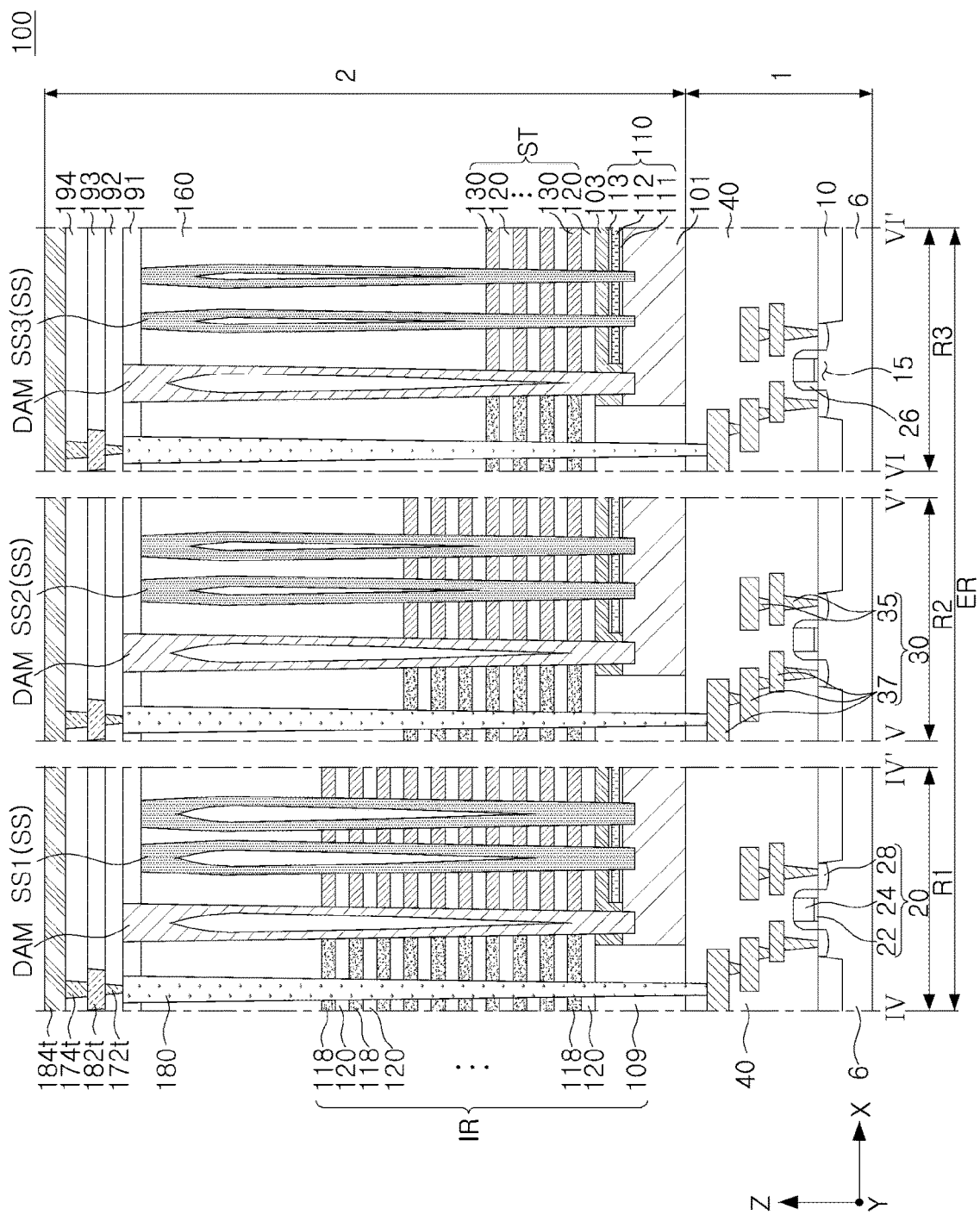
FIG. 4C is a schematic cross-sectional view of a semiconductor device according to example embodiments.

FIGS. 4A and 4B are schematic plan views of semiconductor devices according to example embodiments. FIG. 4C is a schematic cross-sectional view of a semiconductor device along lines IV-IV', VI-VI', and V-V' of FIG. 4A. FIG. 4C also corresponds to the sections taken along lines IV-IV', VI-VI', and V-V' in FIG. 4B.

Referring to FIGS. 4A to 4C, the semiconductor device 100 may further include a lower structure 1 disposed below the substrate 101. The lower structure 1 may include a lower substrate 6, circuit elements 20 on the lower substrate 6, a lower interconnection structure 30 electrically connected to the circuit elements 20, and a lower capping layer 40. The lower structure 1 may include a region in which peripheral circuit regions for operation of memory cells of the semiconductor device 100 are disposed, and the lower structure 1 may provide e.g., a row decoder, a page buffer, other peripheral circuits, and the like. An upper structure 2 may be positioned on the lower structure 1, and may include the embodiment described with reference to FIGS. 1-2C. That is, the upper structure 2 may include the substrate 101, the stack structure ST, the channel structures CH, the separation structures MS, the support structures SS, and the like described with reference to FIGS. 1 to 2C. The upper structure 2 may further include a through-interconnection region TR for providing an electrical connection path between the upper structure 2 and the lower structure 1.

The lower substrate 6 may include a semiconductor material, e.g., a group IV semiconductor, a group III-V compound semiconductor, or a group II-VI compound semiconductor. For example, the group IV semiconductor may include silicon (Si), germanium (Ge), or silicon-germanium (SiGe). The lower substrate 6 may be a single crystal silicon substrate. Device isolation layers 10 may be disposed in the lower substrate 6, and source/drain regions 28 including impurities may be disposed in a portion of an active region 15 defined between the device isolation layers 10.

The circuit elements 20 may each include a transistor including a circuit gate dielectric layer 22, a circuit gate electrode 24, and the source/drain regions 28. The source/drain regions 28 may be disposed on both sides of the circuit gate electrode 24 in the active region 15. A spacer layer 26 may be disposed on both sides of the circuit gate electrode 24, and the circuit gate electrode 24 and the source/drain regions 28 may be insulated from each other. The circuit gate dielectric layer 22 may include, e.g., silicon oxide, silicon nitride, silicon oxynitride, or a high-κ material. The circuit gate electrode 24 may include at least one of, e.g., titanium nitride (TiN), tantalum nitride (TaN), tungsten nitride (WN), titanium silicon nitride (TiSiN), tantalum silicon nitride (TaSiN), and tungsten silicon nitride (WSiN), tungsten (W), copper (Cu), aluminum (Al), molybdenum (Mo), and ruthenium (Ru). The circuit gate electrode 24 may include a semiconductor layer, e.g., a doped polycrystalline silicon layer, and may also include a layer of material, e.g., a metal-semiconductor compound. In an example embodiment, the circuit gate electrode 24 may include two or more multilayers.

The lower interconnection structure 30 may be electrically connected to the circuit gate electrodes 24 and the source/drain regions 28 of the circuit elements 20. The lower interconnection structure 30 may include lower contact plugs 35 having a cylindrical or truncated cone shape, and lower interconnection lines 37 having at least one region in the form of a line. A portion of the lower contact plugs 35 may be connected to the source/drain regions 28, e.g., other portions of the lower contact plugs 35 may be connected to the circuit gate electrodes 24. The lower contact plugs 35 may electrically connect the lower interconnection lines 37 disposed at different levels from the upper surface of the lower substrate 6 to each other. The lower interconnection structure 30 may include a conductive material, e.g., tungsten (W), copper (Cu), aluminum (Al), or the like, and respective components thereof may further include a diffusion barrier including at least one of, e.g., titanium (Ti), titanium nitride (TiN), tantalum (Ta), tantalum nitride (TaN), and tungsten nitride (WN). In example embodiments, the number of layers and the arrangement of the lower contact plugs 35 and the lower interconnection lines 37 constituting the lower interconnection structure 30 may be variously changed.

The lower capping layer 40 may be disposed to cover the lower substrate 6, the circuit elements 20, and the lower interconnection structure 30. The lower capping layer 40 may be formed of, e.g., silicon oxide, silicon nitride, silicon oxynitride, or silicon oxycarbide. The lower capping layer 40 may include a plurality of insulating layers. The lower capping layer 40 may include an etch stop layer formed of silicon nitride.

The through-interconnection region TR may be disposed in the step region ER of the stack structure ST. For example, one or a plurality of through-interconnection regions TR may be disposed per one memory block, and may also be disposed in the memory cell array region MCA. One or a plurality of the through-interconnection regions TR may be disposed in each region R1, R2, and R3 per one memory block. However, the number, size, arrangement, and shape of the through-interconnection regions TR may be variously changed in the example embodiments. The through-interconnection region TR may include through-contact plugs 180 penetrating through the substrate 101 and extending in the Z-direction, and an insulating region IR surrounding the through-contact plugs 180. The insulating region IR may include sacrificial layers 118, a lower through insulating layer 109, and a barrier structure DAM.

The through-interconnection region TR may be disposed between the separation structures MS1 and MS2. For example, the through-interconnection region TR may be disposed between a pair of first separation structures MS1 adjacent to each other in the Y-direction. The through-interconnection region TR may be disposed between the second separation structures MS2 adjacent to each other in the X-direction. The through-interconnection region TR may have a symmetrical shape (FIG. 4A) or an asymmetrical shape (FIG. 4B) when viewed with respect to the first separation structure MS1.

The insulating region IR is a region in which the gate electrodes 130 do not extend, and may include an insulating stack structure in which sacrificial layers 118 and interlayer insulating layers 120 are stacked. The sacrificial layers 118 of the insulating region IR may be disposed on substantially the same level as the gate electrodes 130, and may be spaced apart from the gate electrodes 130 by the barrier structure DAM. The lower through insulating layer 109 may be disposed in a region from which portions of the substrate 101, the insulating layers 110, and the second conductive layer 103 have been removed, and may be disposed to be surrounded by the substrate 101, the insulating layers 110, and the second conductive layer 103. The lower through insulating layer 109 may include a plurality of insulating layers. The lower through insulating layer 109 may have a width different from that of the sacrificial layers 118, or may have the same width depending on example embodiments.

The through-contact plugs 180 may vertically penetrate through the entire insulating region IR and extend perpendicularly to the upper surface of the substrate 101, and may electrically connect the circuit elements 20 of the upper structure 2 and the lower structure 1 to each other. For example, the through-contact plugs 180 may electrically connect the gate electrodes 130 and/or the channel structures CH of the upper structure 2 to the circuit elements 20 of the lower structure 1. The through-contact plugs 180 may be electrically connected to the upper interconnection structure. For example, the through-contact plugs 180 may be connected to an upper connection contact 172*t* to be electrically connected to the gate electrodes 130. The through-contact plugs 180 may be connected to the uppermost interconnection line among the lower interconnection lines 37.

The through-contact plugs 180 may pass through the interlayer insulating layers 120 and the sacrificial layers 118 of the insulating region IR, and lower portions thereof may pass through the lower through insulating layer 109. The number, shape, and shape of the through-contact plugs 180 in one through-interconnection region TR may be variously changed in some embodiments. In some embodiments, the through-contact plugs 180 may have a form in which a plurality of layers are connected. Also, according to example embodiments, in addition to the through-contact plugs 180, interconnection structures in the form of interconnection lines may be further disposed in the insulating region IR. The through-contact plugs 180 may include a conductive material, e.g., at least one of titanium nitride (TiN), tantalum nitride (TaN), tungsten nitride (WN), titanium silicon nitride (TiSiN), tantalum silicon nitride (TaSiN), tungsten silicon nitride (WSiN), tungsten (W), copper (Cu), aluminum (Al), molybdenum (Mo), and ruthenium (Ru).

The barrier structure DAM may be disposed to surround the insulating region IR in the step region ER. The barrier structure DAM may include, in a plan view, horizontal regions disposed in a straight line with the first and second separation structures MS1 and MS2 extending in the X-direction, and vertical regions extending in the Y-direction. In this embodiment, the horizontal regions and the vertical regions may form a single closed-curve, the barrier structure DAM may be disposed in a slit having a rectangular ring or a similar shape, in a plan view. The barrier structure DAM prevents a conductive material forming the gate electrodes 130 from flowing into the insulating region IR during a manufacturing process of the semiconductor device.

Figure 5A:
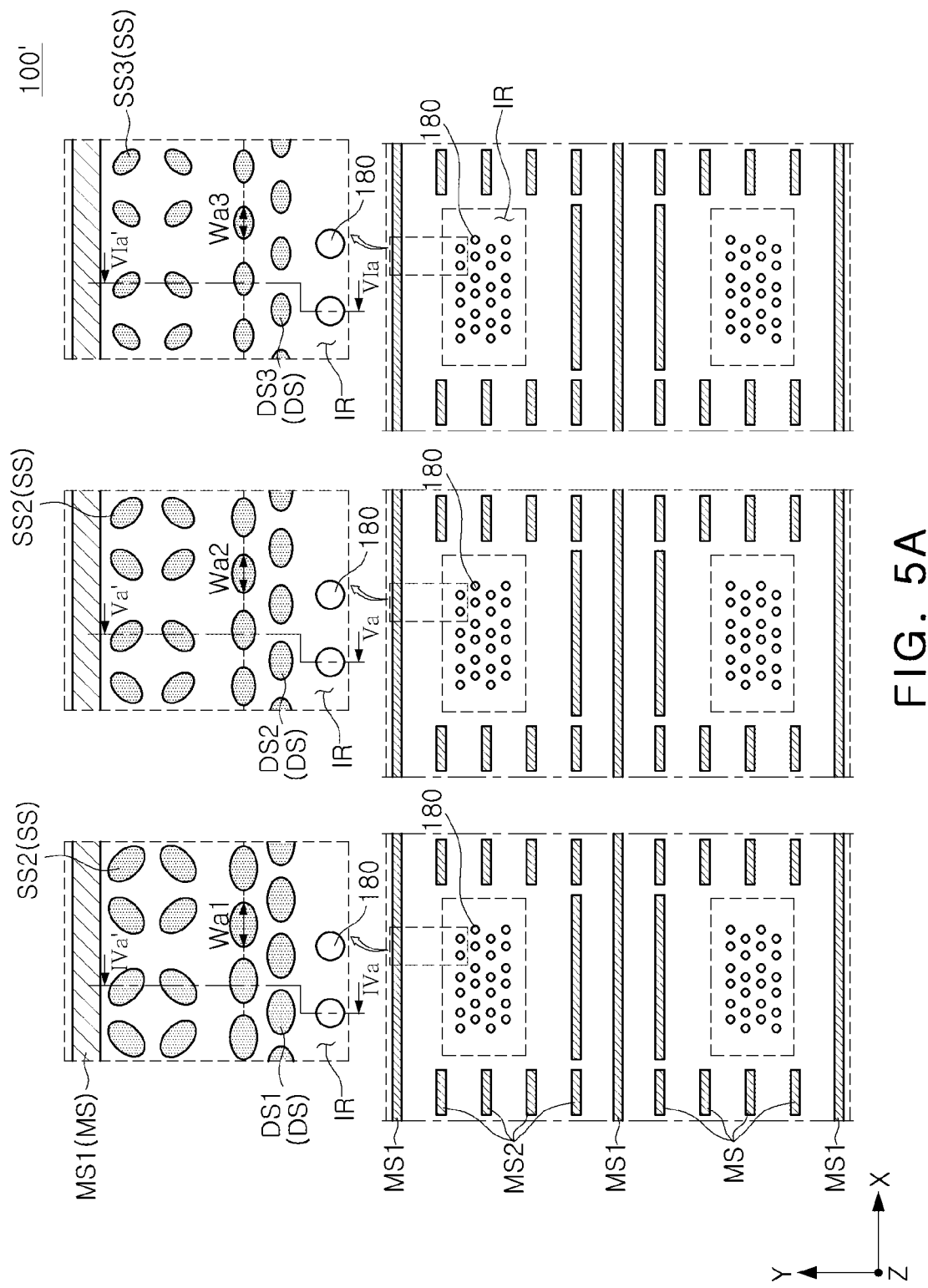
FIG. 5A is a schematic plan view of a semiconductor device according to example embodiments.
Figure 5B:
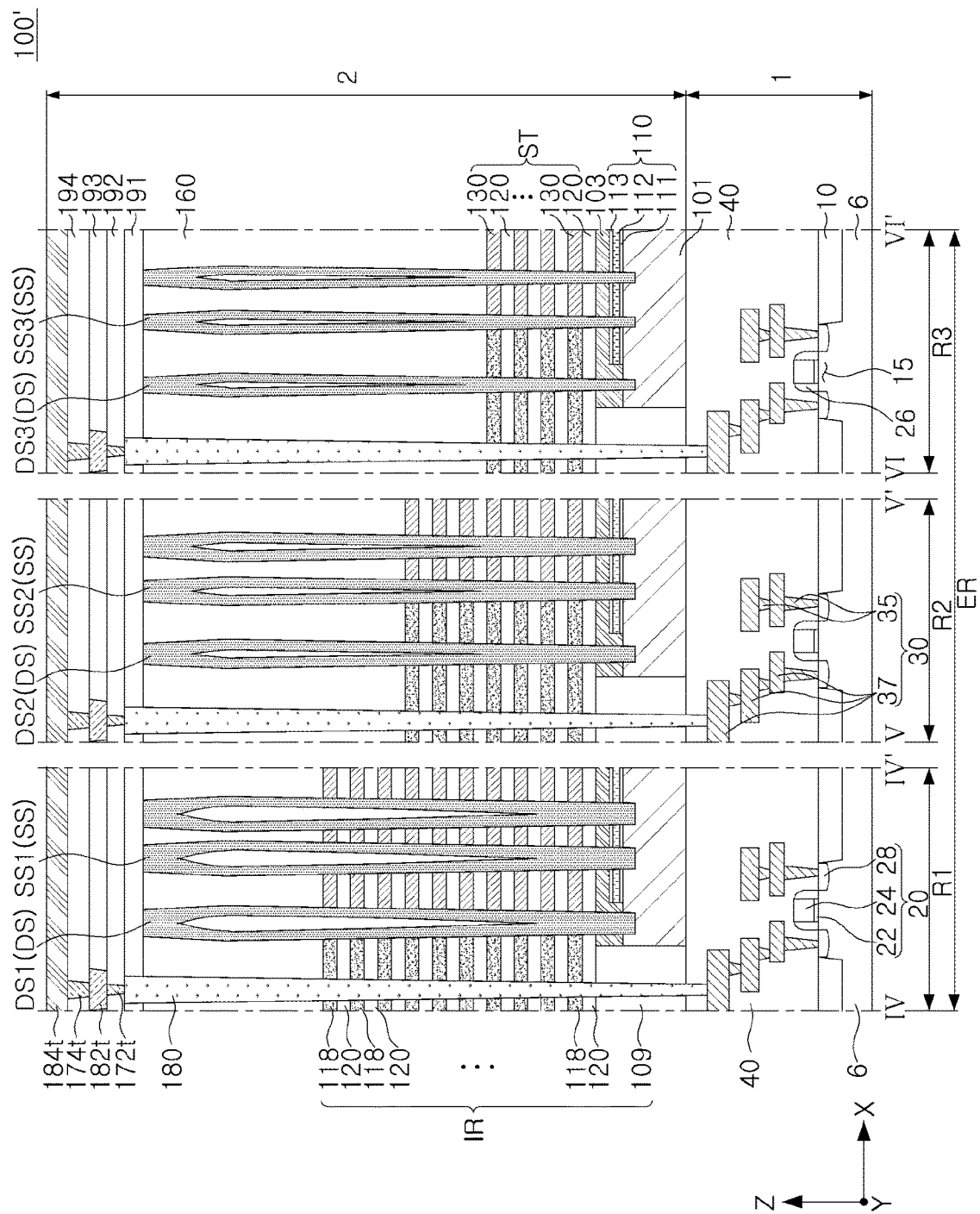
FIG. 5B is a schematic cross-sectional view of a semiconductor device according to example embodiments.

FIG. 5A is a schematic plan view of a semiconductor device according to example embodiments. FIG. 5B is a schematic cross-sectional view of a semiconductor device according to example embodiments. FIG. 5B illustrates cross-sections taken along lines IVa-IVa', Va-Va', and VIa-Va' in FIG. 5A.

Referring to FIGS. 5A and 5B, a semiconductor device 100' may include the lower structure 1 and the upper structure 2, as described with reference to FIGS. 4A to 4C, and may further include barrier support structures DS in which the through-interconnection region TR does not include the barrier structure DAM, and which is disposed to surround the insulating region IR. For example, referring to FIG. 5A, the barrier support structures DS may be aligned along the X-direction to separate between the through-contact plugs 180 and the support structures SS in the Y-direction.

The barrier support structures DS may partially block a conductive material forming the gate electrodes 130 from flowing into the insulating region IR during a manufacturing process of the semiconductor device. Accordingly, the sacrificial layers 118 may remain to provide the insulating region IR in which the through-contact plugs 180 are disposed. Since the through-interconnection region TR is asymmetrically disposed in the Y-direction within one memory block, to improve the stability of the stack structure ST, a maximum width of the support structures SS may vary depending on the regions R1, R2, and R3. Similarly, the width or the maximum width of the barrier support structures DS may vary according to the regions R1, R2, and R3. For example, a first width Wa1 of a first barrier support structure DS1 positioned in the first region R1 may be greater than a second width Wa1 of the first barrier support structure DS2 positioned in the second region R2, and a second width Wa2 may be greater than a third width Wa3 of the third barrier support structure DS3 positioned in the third region R3. For example, the first width Wa1 and the second width Wa2 may be greater than the third width Wa3, but may be substantially equal to each other. For example, the first width Wa1 may be greater than the second width Wa2 and the third width Wa3, and the second width Wa2 and the third width Wa3 may be substantially equal to each other.

Figure 6:
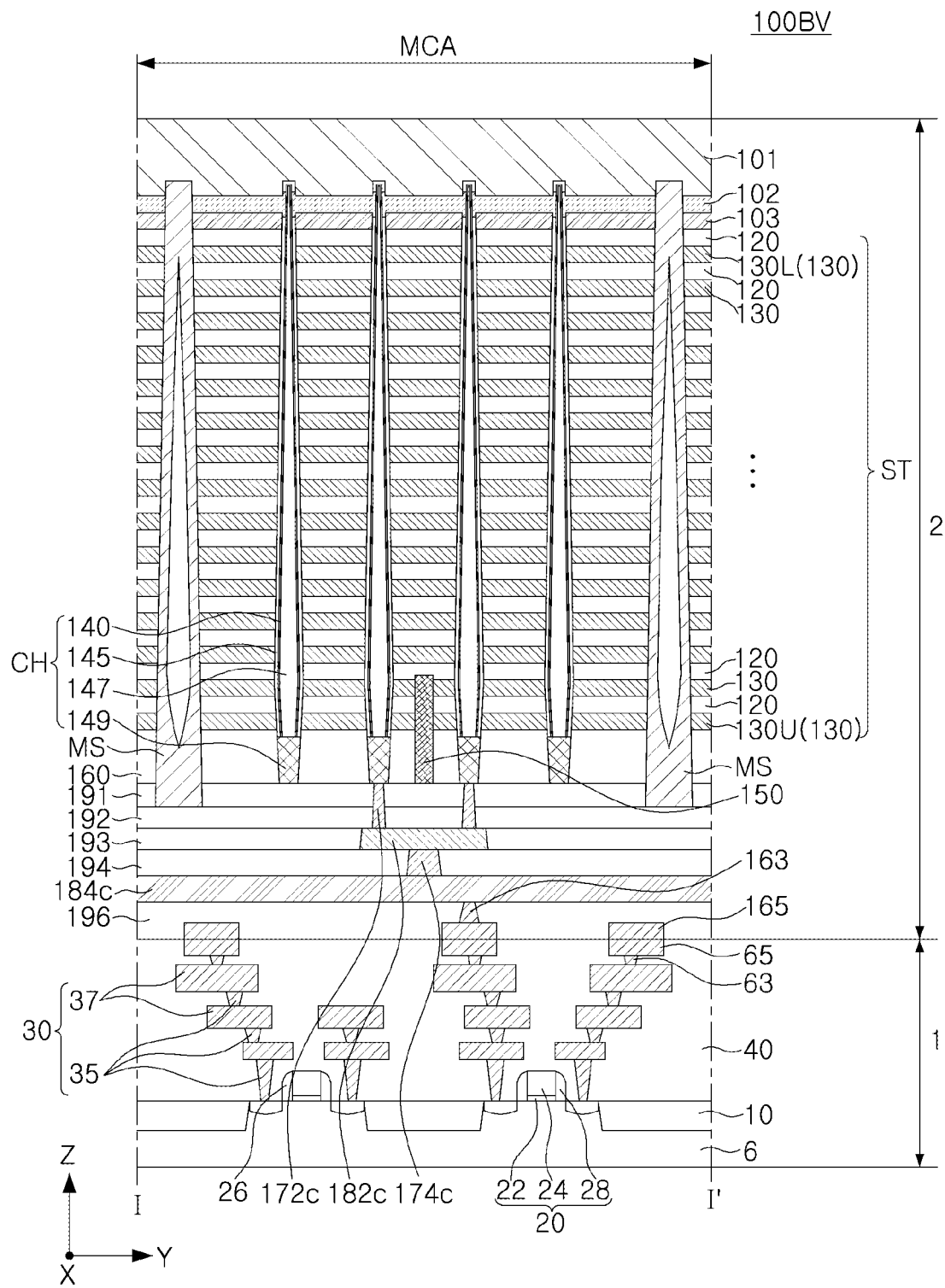
FIG. 6 is a schematic cross-sectional view of a semiconductor device according to example embodiments.

FIG. 6 is a schematic cross-sectional view of a semiconductor device according to example embodiments.

Referring to FIG. 6, the lower structure 1 and the upper structure 2 of a semiconductor device 100BV may be bonded to each other through a bonding structure without a separate adhesive layer. The upper structure 2 is illustrated by vertically inverting the upper structure 2 of the semiconductor device 100 of FIG. 2. The semiconductor device 100BV may further include an upper bonding pad 165 and a lower bonding pad 65. The upper structure 2 may further include the third upper insulating layer 193. The upper bonding pad 165 may be electrically connected to the upper interconnection structure through a separate upper bonding via 163, and the lower bonding pad 65 may be electrically connected to the circuit elements 20 through a separate lower via 63. The lower bonding pad 65 and the upper bonding pad 165 may each include, e.g., tungsten (W), aluminum (Al), copper (Cu), tungsten nitride (WN), tantalum nitride (TaN), titanium nitride (TiN), or combinations thereof. The lower bonding pad 65 and the upper bonding pad 165 may function as bonding layers for bonding the lower structure 1 and the upper structure 2. In addition, the lower bonding pad 65 and the upper bonding pad 165 may provide an electrical connection path between the lower structure 1 and the upper structure 2. For example, the lower bonding pad 65 and the upper bonding pad 165 may be bonded by copper, i.e., copper-copper bonding. In another example, the lower structure 1 and the upper structure 2 may be bonded by dielectric-to-dielectric bonding, e.g., bonding by dielectric layers forming a portion of each of a sixth upper insulating layer 196 and the lower capping layer 40 and surrounding the upper bonding pad 165 and the lower bonding pad 65.

Figure 9A:
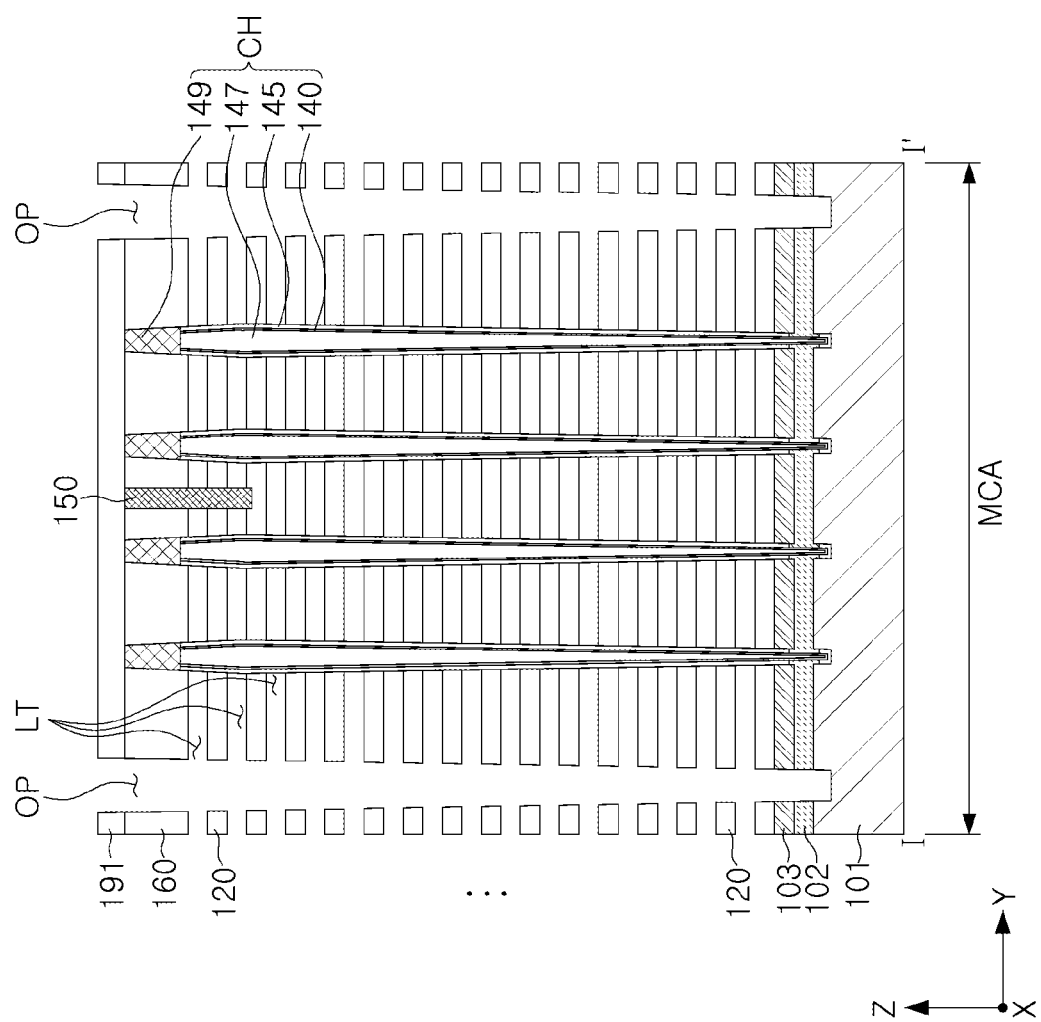
Figure 9B:
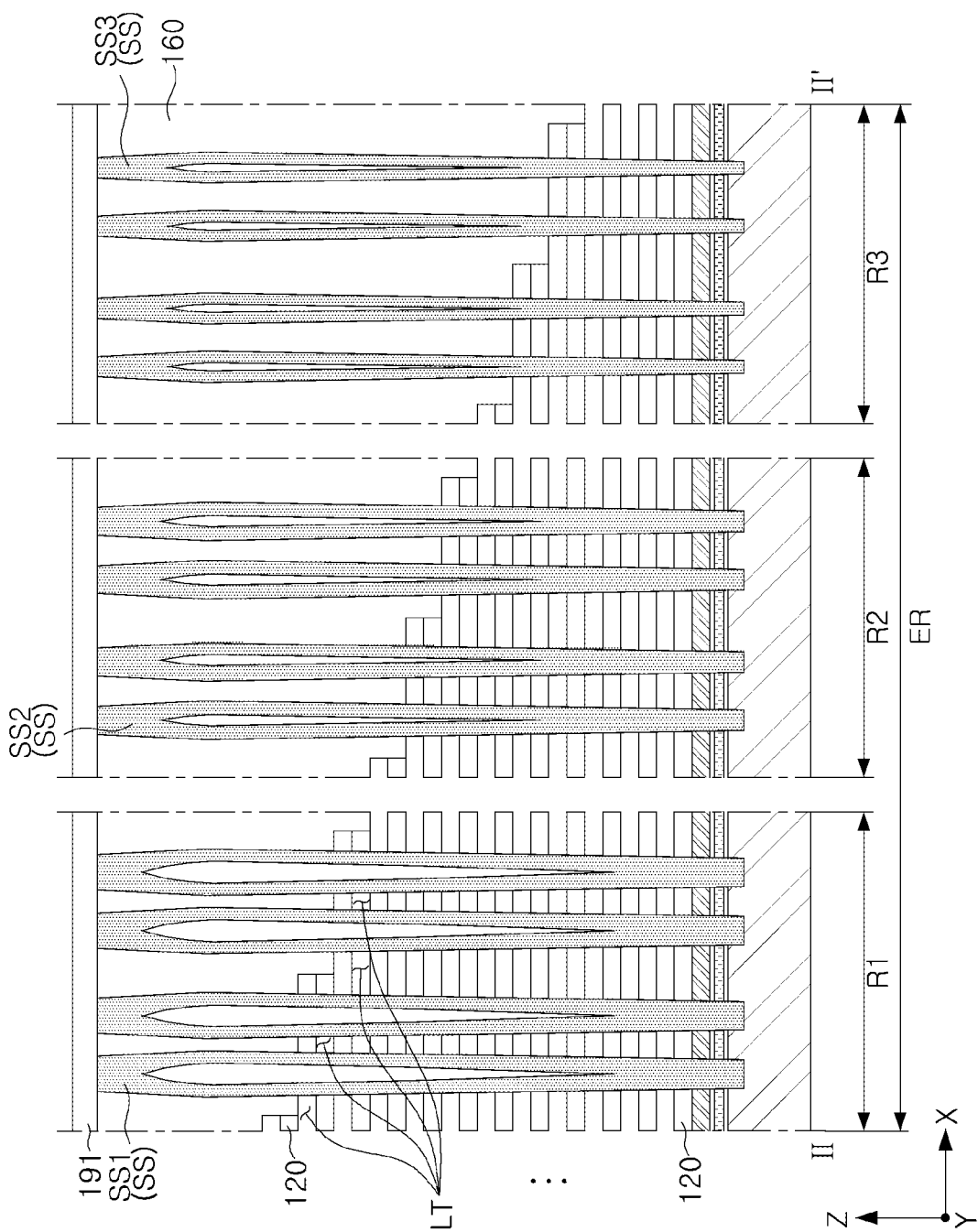
Figure 10A:
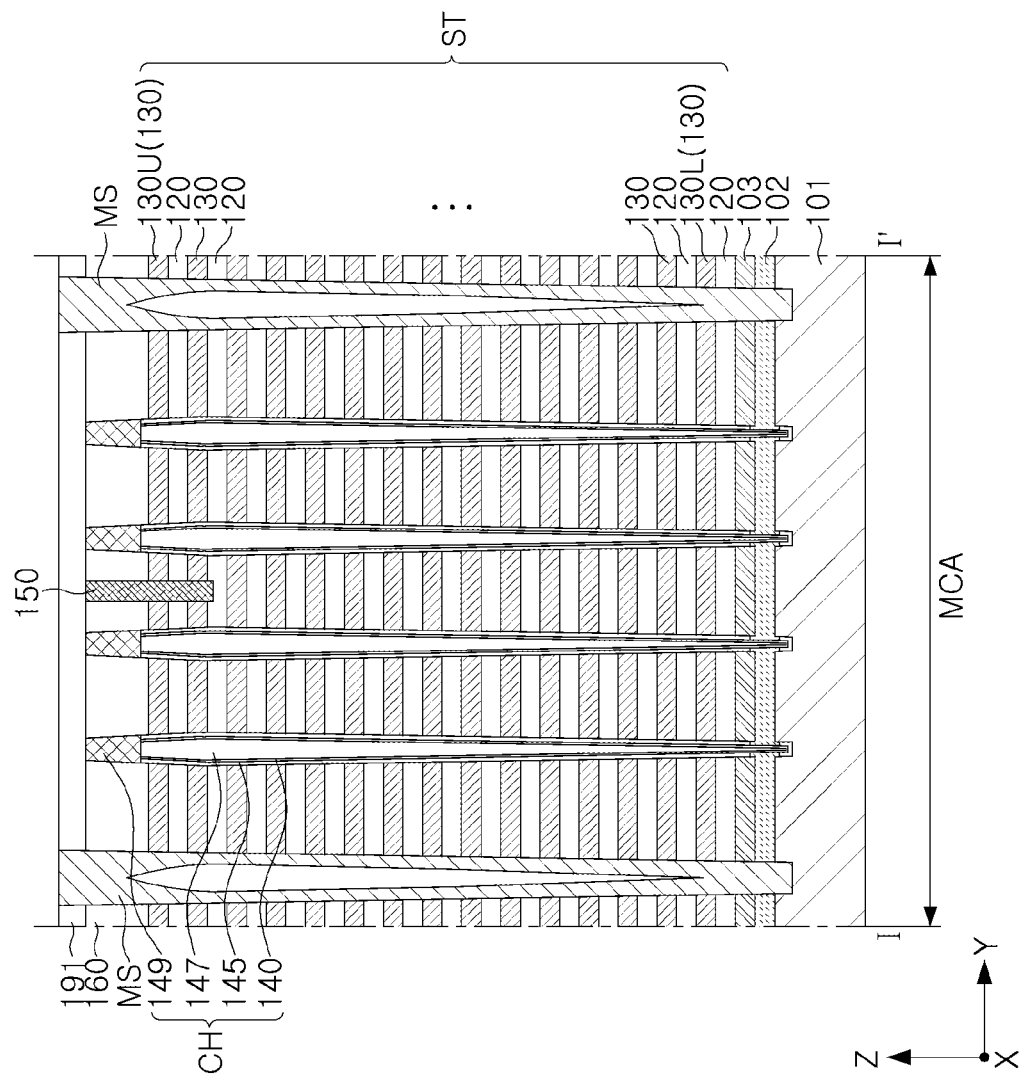
Figure 10B:
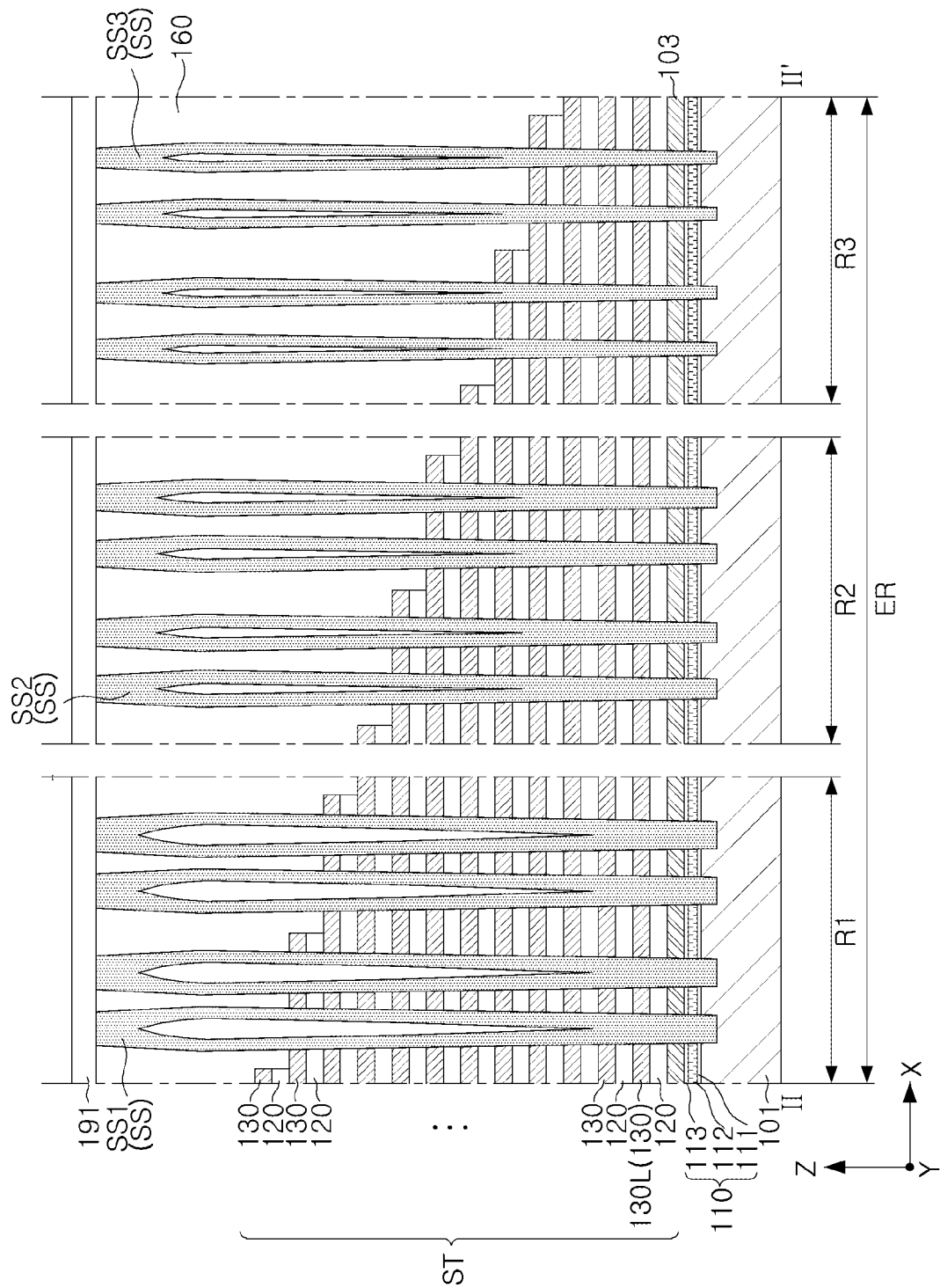
Figure 11:
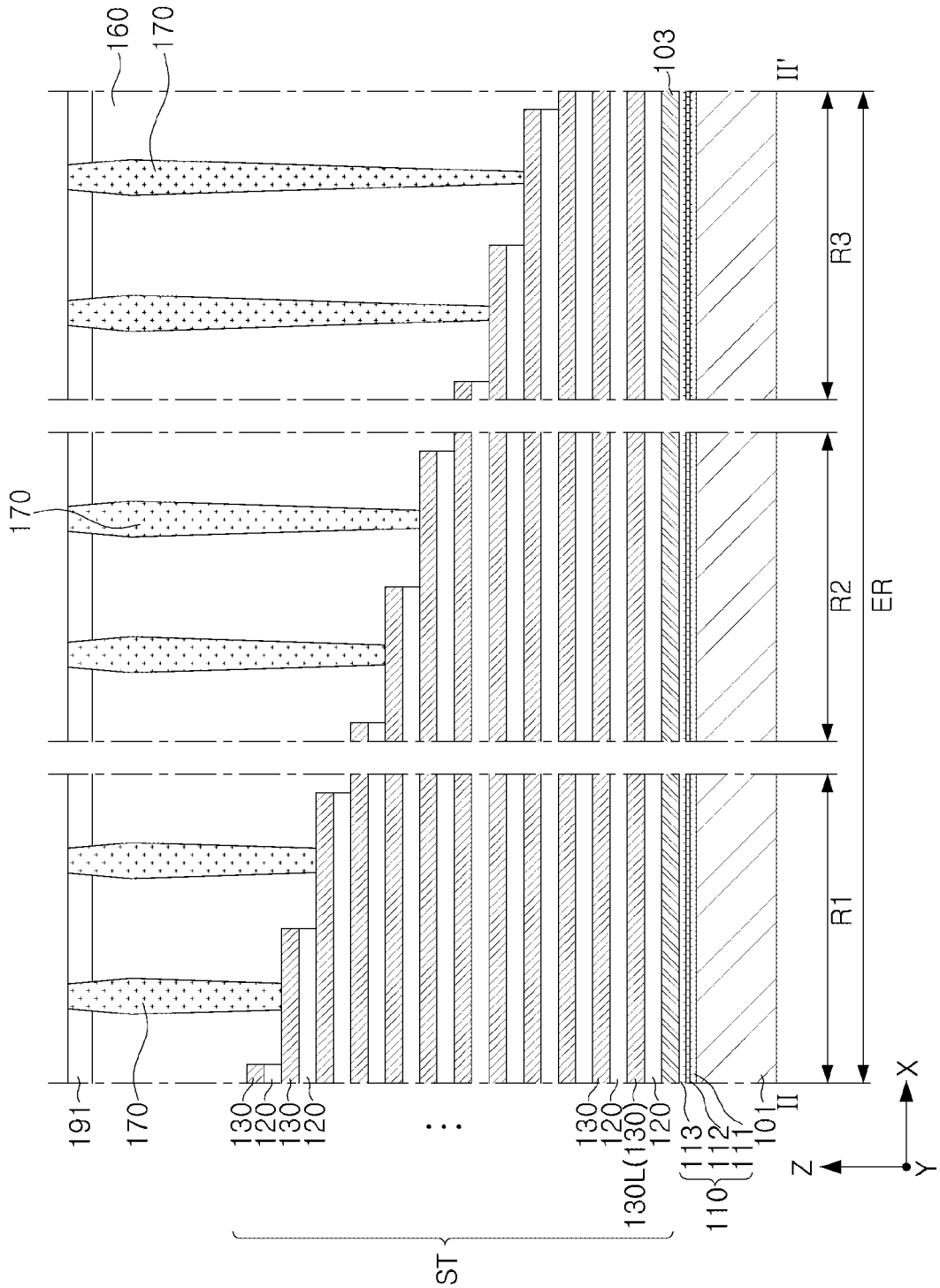

FIGS. 7A, 7B, 8A, 8B, 9A, 9B, 10A, 10B, and 11 are schematic views illustrating stages in a method of manufacturing a semiconductor device according to example embodiments. FIGS. 7A, 7B, 8A, 8B, 9A, 9B, 10A, 10B correspond to respective FIGS. 2A and 2B. FIG. 11 corresponds to FIG. 2C.

Figure 7A:
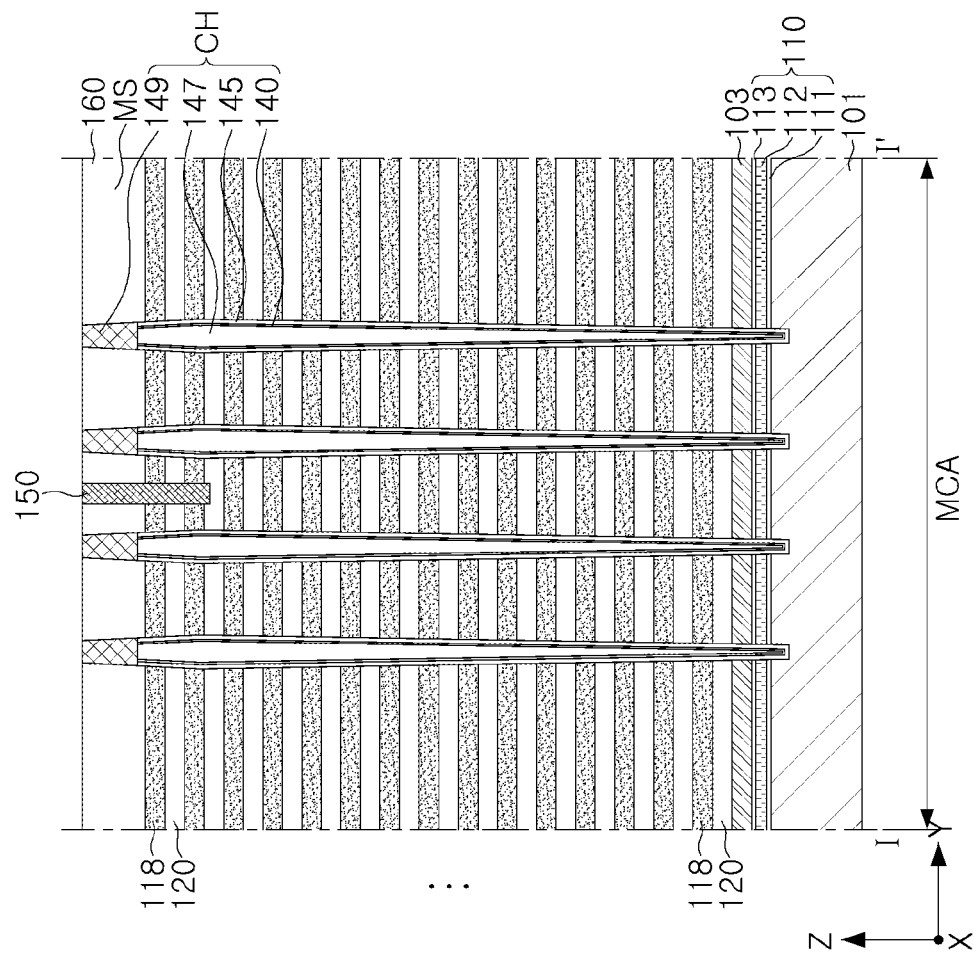
FIGS. 7A, 7B, 8A, 8B, 9A, 9B, 10A, 10B, and 11 are schematic views of stages in a method of manufacturing a semiconductor device according to example embodiments.
Figure 7B:
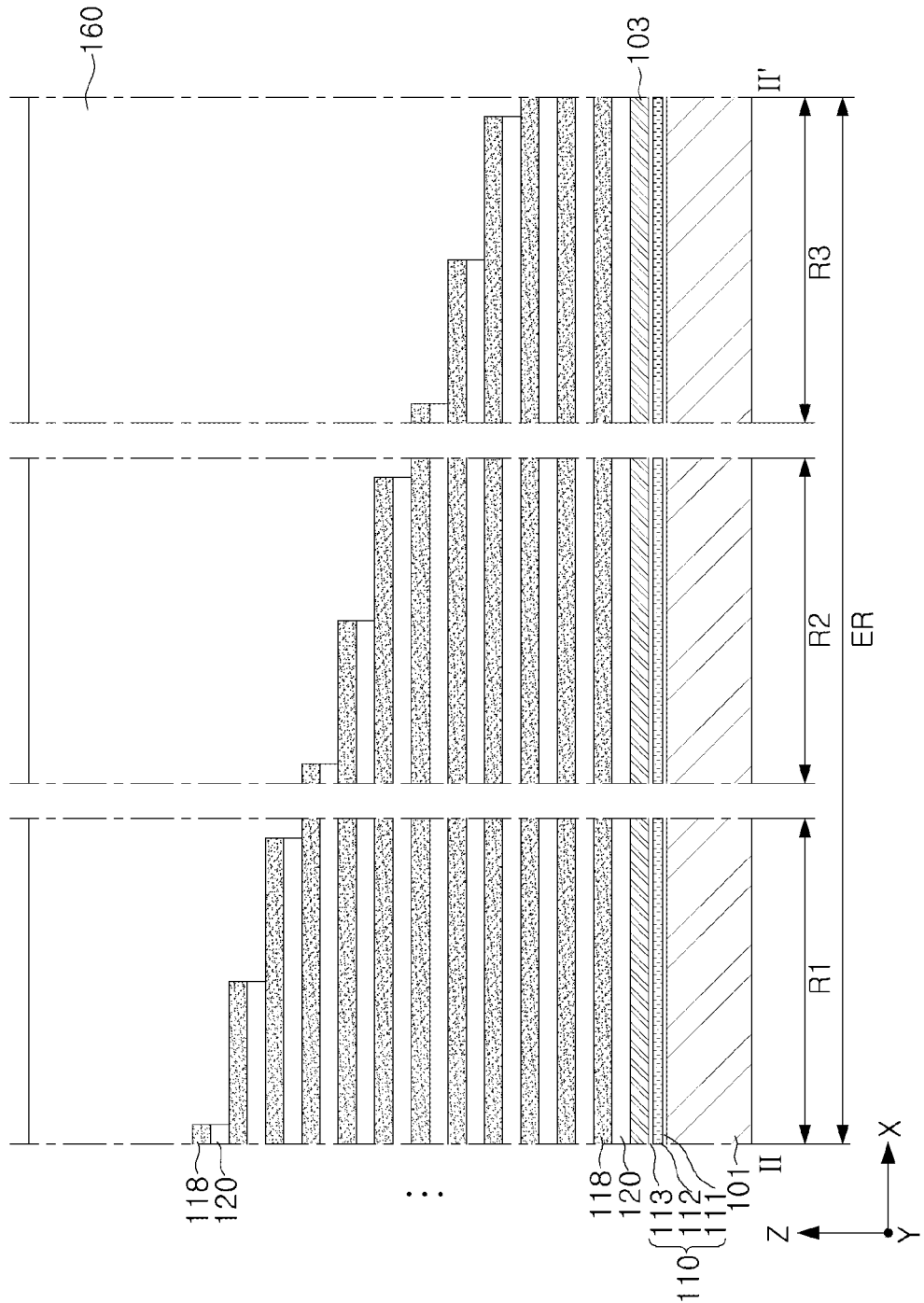

Referring to FIGS. 7A and 7B, sacrificial layers 118 and interlayer insulating layers 120 may be alternately stacked on a substrate 101 to form channel structures CH.

The substrate 101 may be formed of a semiconductor material, e.g., monocrystalline silicon or polycrystalline silicon. Impurities may be implanted into some regions of the substrate 101.

Before the sacrificial layers 118 and the interlayer insulating layers 120 are alternately stacked, the insulating layers 110 and the second conductive layer 103 may be formed on the substrate 101. The first to third insulating layers 111, 112, and 113 constituting the insulating layers 110 may be sequentially stacked on the substrate 101. The insulating layers 110 may be layers that are partially replaced with the first conductive layer 102 of FIG. 2A through a subsequent process. The second conductive layer 103 may be formed on the insulating layers 110. The second conductive layer 103 may be bent along end portions of the insulating layers 110, may cover the ends, and may extend to contact the substrate 101. To form the insulating region IR as illustrated in FIG. 4C, the lower through insulating layer 109 penetrating through the substrate 101, the insulating layers 110, and the second conductive layer 103 may be formed. In some embodiments, the process of forming the insulating layers 110 and the second conductive layer 103 may be omitted.

The sacrificial layers 118 may be layers that are partially replaced by the gate electrodes 130 (refer to FIG. 2A) through a subsequent process. The sacrificial layers 118 may be formed of a material different from that of the interlayer insulating layers 120. For example, the sacrificial layers 118 may be formed of a material having an etch selectivity with respect to the interlayer insulating layers 120 under specific etch conditions. For example, the sacrificial layers 118 may be formed of silicon nitride, and the interlayer insulating layers 120 may be formed of silicon oxide. In example embodiments, portions of the interlayer insulating layers 120 may have different thicknesses. The thickness of the interlayer insulating layers 120 and the sacrificial layers 118 and the number of films constituting the same may be variously changed from those illustrated.

Next, the upper capping layer 160 may be formed, the upper separation structure 150 may be formed, and the channel structures CH may be formed.

The upper separation structure 150 may be formed by exposing the region in which the upper separation structure 150 is to be formed using a separate mask layer, removing a predetermined number of sacrificial layers 118 and interlayer insulating layers 120 from the top, and then depositing an insulating material.

The channel structures CH may be formed by anisotropically etching the sacrificial layers 118 and the interlayer insulating layers 120 to form hole-shaped channel holes and then sequentially depositing a plurality of layers inside the channel holes. For example, after sequentially forming the gate dielectric layer 145, the channel layer 140, and the core insulating layer 147 in the channel hole, the channel pad 149 in contact with the channel layer 140 may be formed on the core insulating layer 147. The channel structures CH may penetrate through the second conductive layer 103 and the insulating layers 110 to contact the substrate 101. In forming the channel holes, support holes corresponding to regions in which the support structures SS are to be formed may be formed together in the step region ER.

Figure 8A:
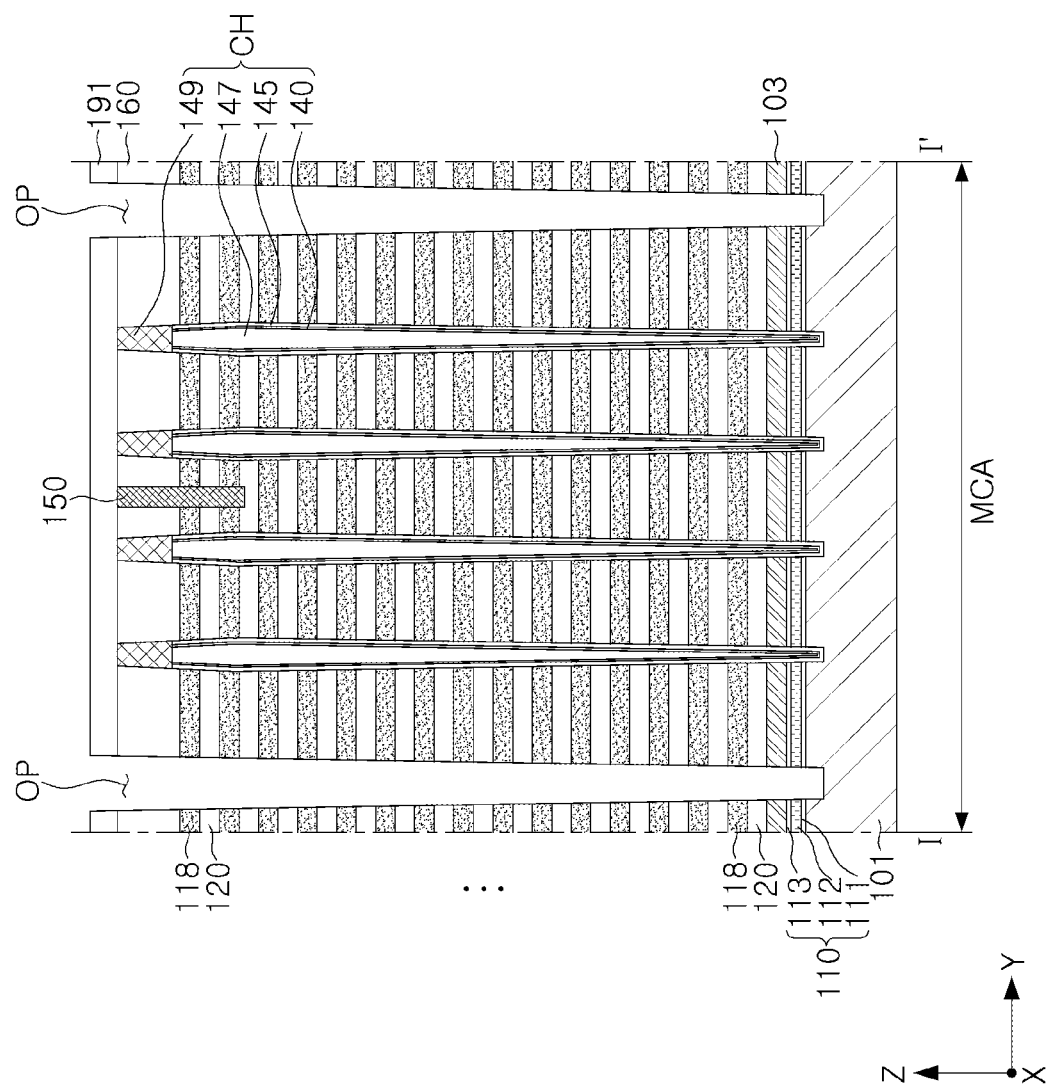
Figure 8B:
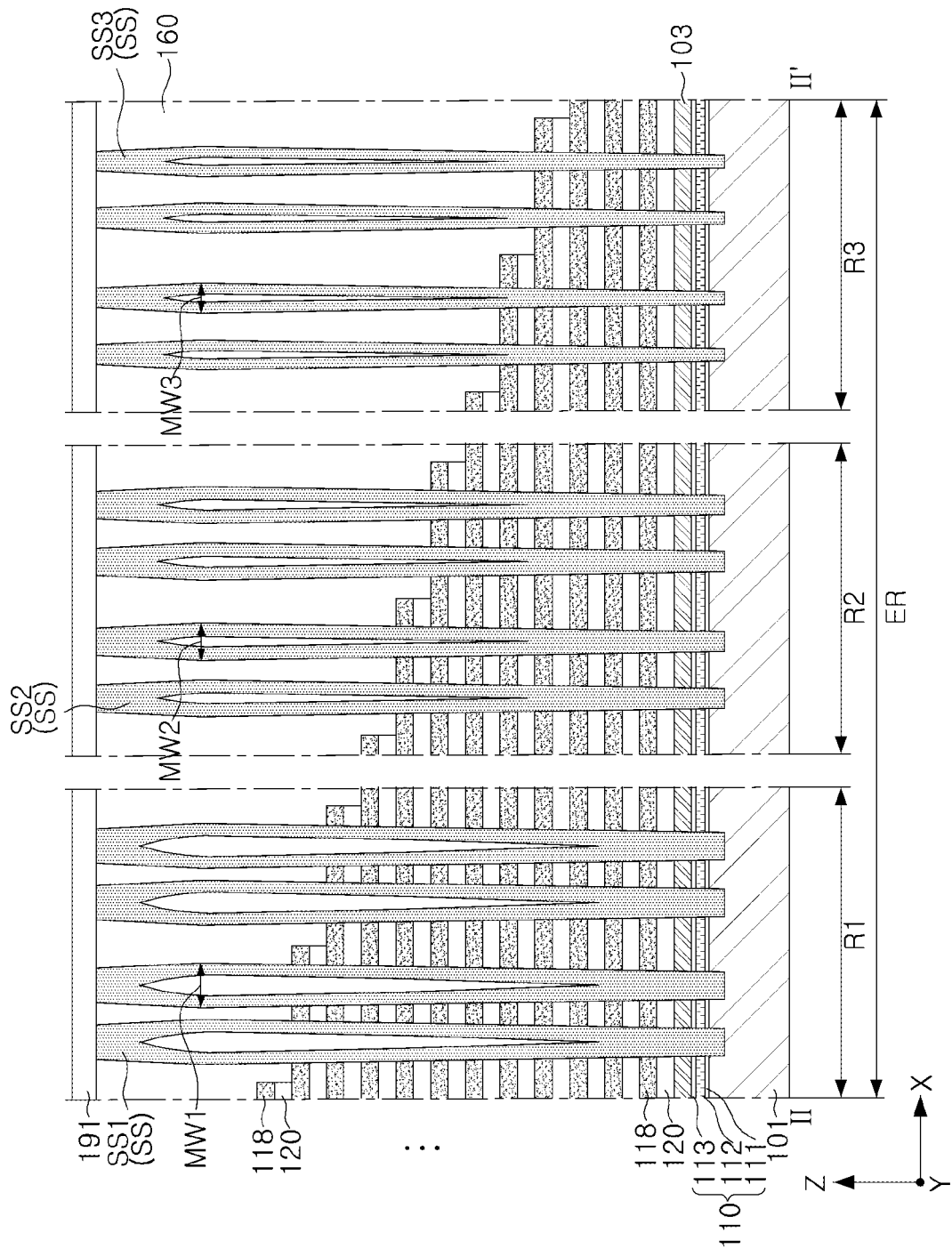

Referring to FIGS. 8A and 8B, the support structures SS passing through the sacrificial layers 118 and the interlayer insulating layers 120 may be formed in the step region ER, and separation openings OP may be formed.

In detail, the support structures SS may be formed by anisotropically etching the sacrificial layers 118 and the interlayer insulating layers 120 to form hole-shaped support holes, and then sequentially depositing one or a plurality of layers inside the support holes. The support structures SS may have different sizes according to the regions R1, R2, and R3. For example, as described above, the maximum width MW1 of the first support structure SS1 in the first region R1 may be greater than the second maximum width MW2 of the second support structure SS2 in the second region R2.

Next, the first upper insulating layer 191 may be formed on the upper capping layer 160, and the separation openings OP passing through the sacrificial layers 118 and the interlayer insulating layers 120 and extending in the X-direction may be formed. The separation openings OP may be formed by forming a mask layer using a photolithography process and by etching the structure on the substrate 101 using the mask layer as an etch mask. The separation openings OP may be formed in a trench shape extending in the X-direction. In this operation, openings for formation of the barrier structure DAM illustrated in FIGS. 4A to 4C may also be formed. In this case, the openings may be formed in a square ring or similar shape.

Referring to FIGS. 9A and 9B, a portion of the insulating layers 110 may be replaced with the first conductive layer 102, and the sacrificial layers 118 exposed through the separation openings OP may be removed.

First, separate sacrificial spacer layers may be formed in the separation openings OP, and by performing an etch-back process, the second insulating layer 112 may be exposed in the memory cell array region MCA. The second insulating layer 112 may be selectively removed from the exposed region, and thereafter, the upper and lower first and third insulating layers 111 and 113 may be removed. The first to third insulating layers 111, 112, and 113 may be removed by, e.g., a wet etching process. In the process of removing the first and third insulating layers 111 and 113, a portion of the gate dielectric layer 145 exposed in the region from which the second insulating layer 112 has been removed may also be removed. After forming the first conductive layer 102 by depositing a conductive material in the region from which the first to third insulating layers 111, 112, and 113 have been removed, the sacrificial spacer layers may be removed in the separation openings OP. Through this process, the first conductive layer 102 may be formed in the memory cell array region MCA. The first conductive layer 102 may be in contact with the substrate 101, and may be formed to contact the exposed channel layer 140 around the channel layer 140.

Next, the sacrificial layers 118 may be selectively removed with respect to the substrate 101, the interlayer insulating layers 120, the channel structures CH, the support structures SS, and the first and second conductive layers 102 and 103. Accordingly, a plurality of horizontal openings LT may be formed between the interlayer insulating layers 120. The channel structures CH and the support structures SS may serve to support the structure of the interlayer insulating layers 120 such that the structure does not collapse.

The sacrificial layers 118 may remain without being removed in the region in which the through-interconnection region TR is to be formed. For example, as illustrated in FIGS. 4A to 4C, an etchant introduced through the separation openings OP may not reach the region in which the through-interconnection region TR is to be formed. Prior to removing the sacrificial layers 118, an operation of selectively removing layers inside the separation openings OP with respect to the upper separation structure 150 may be preceded.

Referring to FIGS. 10A and 10B, the gate electrodes 130 may be formed in the horizontal openings LT, and separation structures MS may be formed in the separation openings OP.

The gate electrodes 130 may be formed by filling the horizontal openings LT (that were formed by removing the sacrificial layers 118) through the separation openings OP with a conductive material. Accordingly, the stack structure ST in which the interlayer insulating layers 120 and the gate electrodes 130 are alternately stacked in the memory cell array region MCA may be formed. Next, the separation structures MS may be formed by filling the separation openings OP with an insulating material. A seam or a void may be formed inside the separation structures MS.

Referring to FIG. 11, the gate contact plugs 170 may be formed. The gate contact plugs 170 may pass through the first and second upper insulating layers 191 and 192 on the step region ER, to be directly connected to the pad portions 130P of the gate electrodes 130.

Next, referring to FIGS. 1 to 2C, the second to fifth upper insulating layers 192, 193, 194 and 195, first upper contacts 172c and 172g, and first interconnection members 182c and 182g, second upper contacts 174c and 174g, and second interconnection members 184c and 184g may be formed, thereby manufacturing the semiconductor device 100.

Figure 12:
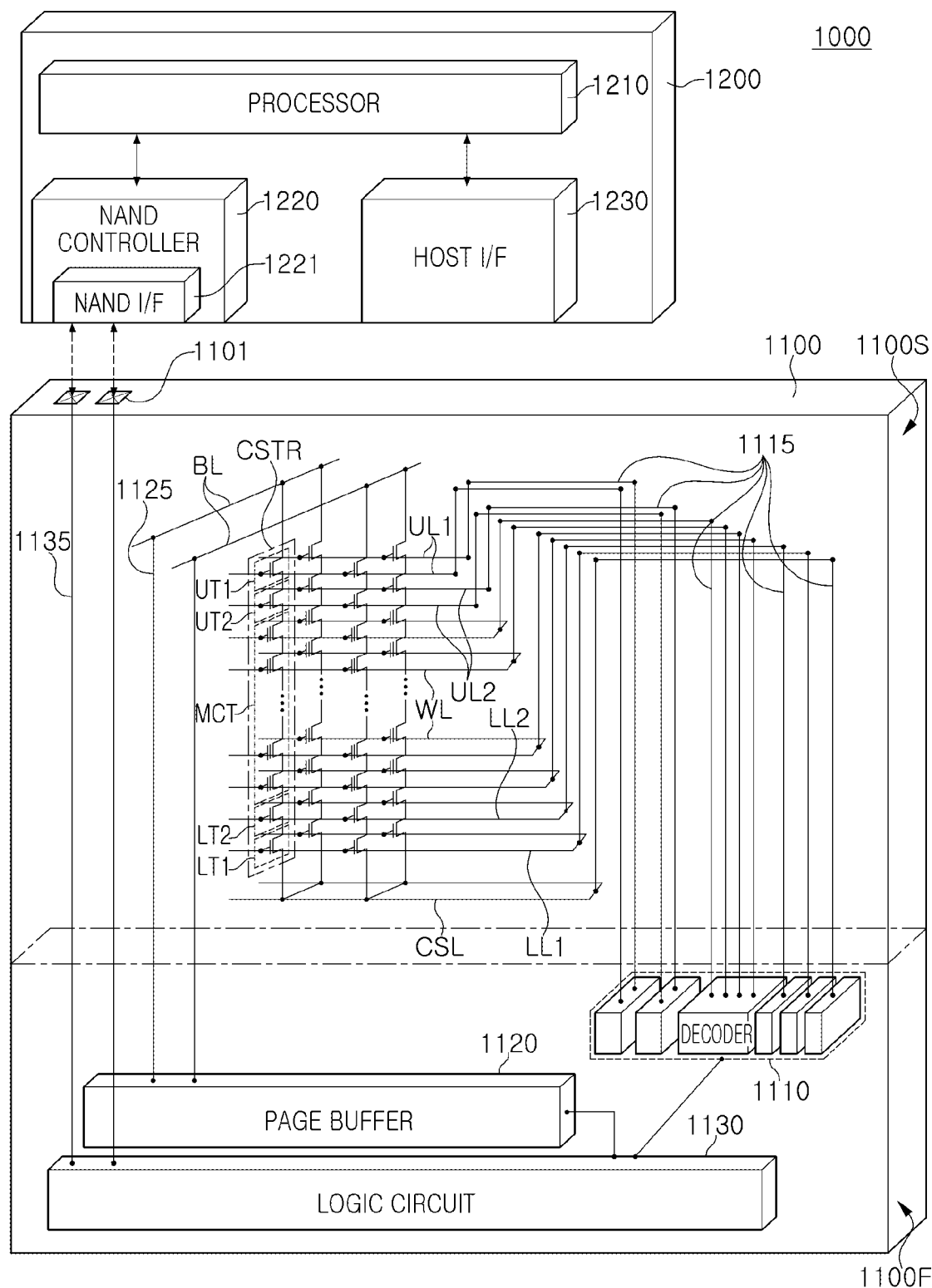
FIG. 12 is a diagram schematically illustrating a data storage system including a semiconductor device according to example embodiments.

FIG. 12 is a diagram schematically illustrating a data storage system including a semiconductor device according to example embodiments.

Referring to FIG. 12, a data storage system 1000 may include a semiconductor device 1100 and a controller 1200 electrically connected to the semiconductor device 1100. The data storage system 1000 may be a storage device including one or a plurality of semiconductor devices 1100 or an electronic device including a storage device. For example, the data storage system 1000 may be a solid state drive device (SSD) device, a Universal Serial Bus (USB), a computing system, a medical device, or a communication device, including one or more semiconductor devices 1100.

The semiconductor device 1100 may be a nonvolatile memory device, e.g., the NAND flash memory device described above with reference to FIGS. 1 to 11. The semiconductor device 1100 may include a first structure 1100F and a second structure 1100S on the first structure 1100F. In example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously modified according to example embodiments.

In example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used for an erase operation of erasing data stored in the memory cell transistors MCT using the GIDL phenomenon.

The common source line CSL, the first and second gate lower lines LL1 and LL2, the word lines WL, and the first and second gate upper lines UL1 and UL2 may be electrically connected to the decoder circuit 1110 through first connection wires 1115 extending from the first structure 1100F to the second structure 1100S. The bit lines BL may be electrically connected to the page buffer 1120 through second connection wires 1125 extending from the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through the input/output pad 1101 electrically connected to the logic circuit 1130. The input/output pad 1101 may be electrically connected to the logic circuit 1130 through an input/output connection line 1135 extending from the first structure 1100F to the second structure 1100S.

The controller 1200 may include a processor 1210, a NAND controller 1220, and a host interface 1230. In some embodiments, the data storage system 1000 may include a plurality of semiconductor devices 1100, and in this case, the controller 1200 may control the plurality of semiconductor devices 1100.

The processor 1210 may control the overall operation of the data storage system 1000 including the controller 1200. The processor 1210 may operate according to a predetermined firmware, and the semiconductor device 1100 may be accessed by controlling the NAND controller 1220. The NAND controller 1220 may include a NAND interface 1221 handling communication with the semiconductor device 1100. Through the NAND interface 1221, a control command for controlling the semiconductor device 1100, data to be written to the memory cell transistors MCT of the semiconductor device 1100, and data to be read from the memory cell transistors MCT of the semiconductor device 1100 may be transmitted. The host interface 1230 may provide a communication function between the data storage system 1000 and an external host. When receiving a control command from an external host through the host interface 1230, the processor 1210 may control the semiconductor device 1100 in response to the control command.

Figure 13:
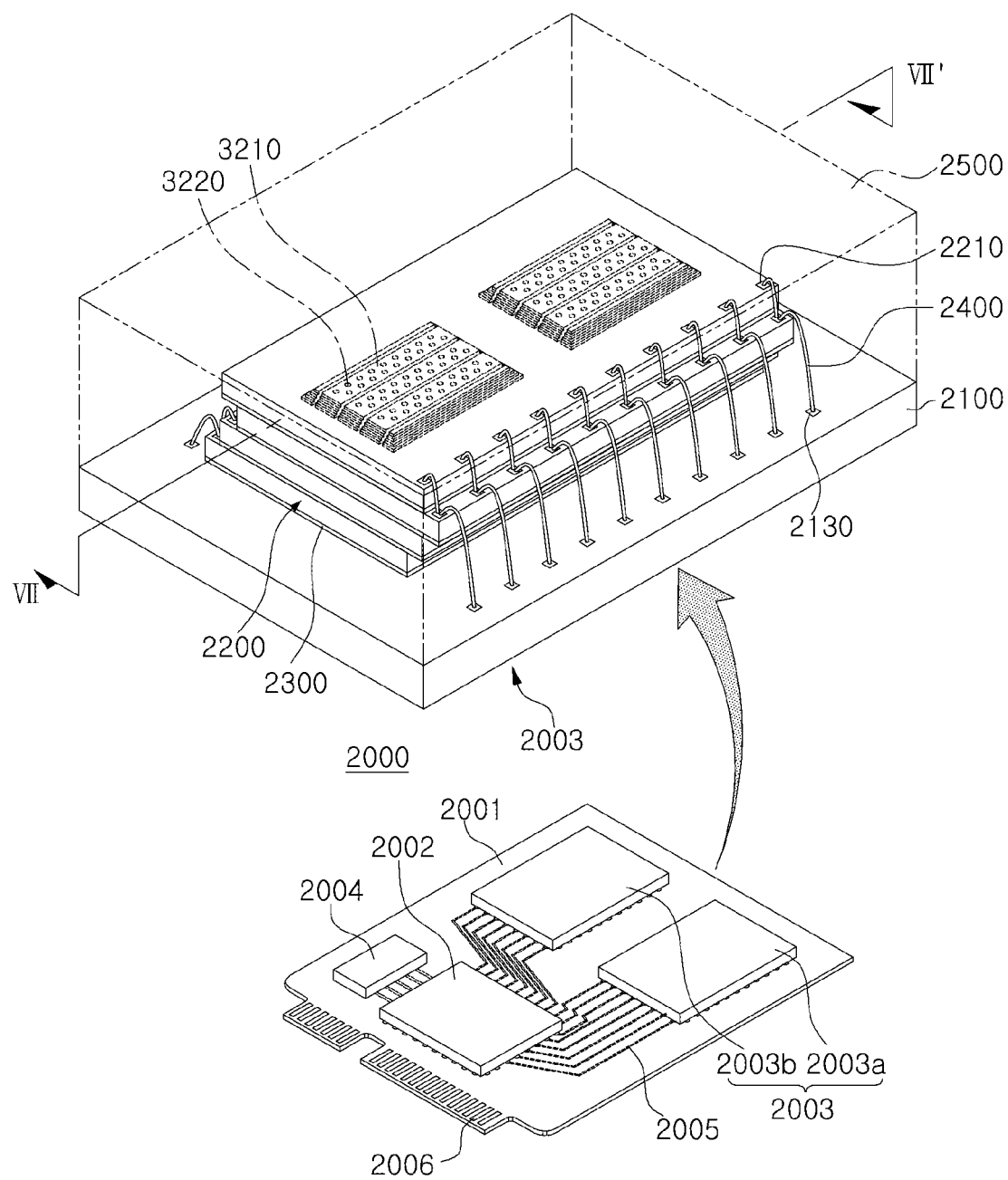
FIG. 13 is a schematic perspective view of a data storage system including a semiconductor device according to an example embodiment.

FIG. 13 is a perspective view schematically illustrating a data storage system including a semiconductor device according to an example embodiment.

Referring to FIG. 13, a data storage system 2000 according to an example embodiment may include a main board 2001, a controller 2002 mounted on the main board 2001, one or more semiconductor packages 2003, and a dynamic random-access memory (DRAM) 2004. The semiconductor package 2003 and the DRAM 2004 may be connected to the controller 2002 by interconnection patterns 2005 formed on the main board 2001.

The main board 2001 may include a connector 2006 including a plurality of pins coupled to an external host. The number and arrangement of the plurality of pins in the connector 2006 may vary according to a communication interface between the data storage system 2000 and the external host. In example embodiments, the data storage system 2000 may communicate with an external host according to any one of interfaces, e.g., Universal Serial Bus (USB), Peripheral Component Interconnect Express (PCI-Express), Serial Advanced Technology Attachment (SATA), and M-Phy for Universal Flash Storage (UFS). In example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to or read data from the semiconductor package 2003, thereby improving the operating speed of the data storage system 2000.

The DRAM 2004 may be a buffer memory for reducing a speed difference between the semiconductor package 2003 as a data storage space and an external host. The DRAM 2004 included in the data storage system 2000 may also operate as a kind of cache memory, and a space for temporarily storing data may be provided in a control operation for the semiconductor package 2003. When the data storage system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 disposed on a lower surface of each of the semiconductor chips 2200, a connection structure 2400 electrically connecting the semiconductor chips 2200 and the package substrate 2100, and a molding layer 2500 covering the semiconductor chips 2200 and the connection structure 2400, on the package substrate 2100.

The package substrate 2100 may be a printed circuit board including package upper pads 2130. Each semiconductor chip 2200 may include an input/output pad 2210. The input/output pad 2210 may correspond to the input/output pad 1101 of FIG. 12. Each of the semiconductor chips 2200 may include gate stack structures 3210 and channel structures 3220. Each of the semiconductor chips 2200 may include the semiconductor device described above with reference to FIGS. 1 to 2C.

In example embodiments, the connection structure 2400 may be a bonding wire electrically connecting the input/output pad 2210 and the package upper pads 2130. Accordingly, in each of the first and second semiconductor packages 2003a and 2003b, the semiconductor chips 2200 may be electrically connected to each other by a wire bonding method, and may be electrically connected to the package upper pads 2130 of the package substrate 2100. According to example embodiments, in each of the first and second semiconductor packages 2003a and 2003b, the semiconductor chips 2200 may be electrically connected to each other by a connection structure including a through electrode (i.e., a through-silicon via (TSV)) instead of the bonding wire-type connection structure 2400.

For example, the controller 2002 and the semiconductor chips 2200 may be included in one package. In another example, the controller 2002 and the semiconductor chips 2200 are mounted on a separate interposer substrate different from the main board 2001, and the controller 2002 and the semiconductor chips 2200 may be connected to each other by an interconnection member formed on the interposer substrate.

Figure 14:
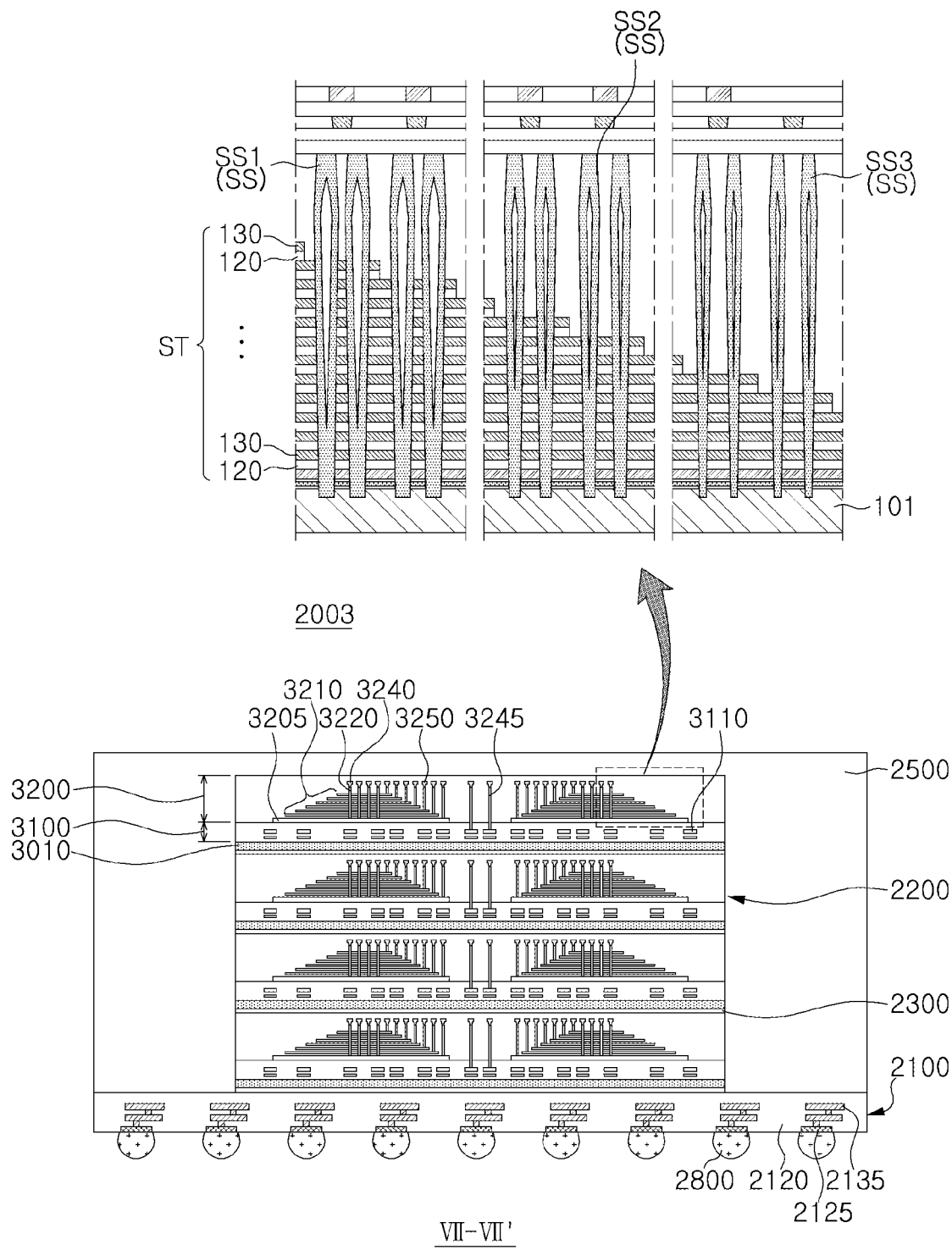
FIG. 14 is a cross-sectional view schematically illustrating a semiconductor package according to an example embodiment.

FIG. 14 is a cross-sectional view schematically illustrating a semiconductor package according to an example embodiment. FIG. 14 illustrates an example embodiment of the semiconductor package 2003 of FIG. 13, and conceptually illustrates a region taken along line VII-VII' of the semiconductor package 2003 of FIG. 13.

Referring to FIG. 14, in the semiconductor package 2003, the package substrate 2100 may be a printed circuit board. The package substrate 2100 may include a package substrate body 2120, the package upper pads 2130 (refer to FIG. 13) disposed on the upper surface of the package substrate body 2120, lower pads 2125 disposed on or exposed through the lower surface of the package substrate body 2120, and internal interconnection members 2135 electrically connecting the upper pads 2130 and the lower pads 2125 inside the package substrate body 2120. The upper pads 2130 may be electrically connected to the connection structures 2400. The lower pads 2125 may be connected to the interconnection patterns 2005 of the main board 2010 of the data storage system 2000 as illustrated in FIG. 13 through conductive connectors 2800.

Each of the semiconductor chips 2200 may include a semiconductor substrate 3010, and a first structure 3100 and a second structure 3200 that are sequentially stacked on the semiconductor substrate 3010. The first structure 3100 may include a peripheral circuit region including peripheral interconnection members 3110. The second structure 3200 may include a common source line 3205, a gate stack structure 3210 on the common source line 3205, channel structures 3220 and isolation regions passing through the gate stack structure 3210, bit lines 3240 electrically connected to the memory channel structures 3220, and gate contact plugs 3250 electrically connected to the word lines WL (refer to FIG. 12) of the gate stack structure 3210. As described above with reference to FIGS. 1 to 6, each of the semiconductor chips 2200 may include the lower substrate 6, the substrate 101, the separation structure MS, the channel structures CH, and the support structures SS.

Each of the semiconductor chips 2200 may include a through-interconnection member 3245 electrically connected to the peripheral interconnection members 3110 of the first structure 3100 and extending into the second structure 3200. The through-interconnection member 3245 may be disposed outside the gate stack structure 3210, and may be further disposed to penetrate through the gate stack structure 3210. Each of the semiconductor chips 2200 may further include an input/output pad 2210 (refer to FIG. 13) electrically connected to the peripheral interconnection members 3110 of the first structure 3100.

By way of summation and review, example embodiments provide a semiconductor device having improved electrical characteristics and reliability. Example embodiments also provide a data storage system including a semiconductor device with improved electrical characteristics and reliability. That is, as set forth above, in the step region of the stack structure, by providing support structures having different structures according to regions, a semiconductor device having improved electrical characteristics and reliability and a data storage system including the same may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a stack structure including gate electrodes and interlayer insulating layers alternately stacked on a substrate, the stack structure having a memory cell array region and a contact region, and the gate electrodes extending in a first direction;
   channel structures passing through the stack structure in the memory cell array region, each of the channel structures including a channel layer;
   separation structures passing through the stack structure and extending in the first direction; and
   support structures between the separation structures and penetrating through the stack structure in the contact region,
   wherein the contact region includes a first region and a second region, the first region being closer to the memory cell array region in the first direction than the second region is,
   wherein the support structures include a first support structure penetrating through the stack structure in the first region and a second support structure penetrating through the stack structure in the second region,
   wherein the first support structure has a first maximum width and the second support structure has a second maximum width, and the first maximum width and the second maximum width are at a level that is higher than a mid-level of an entire length of the first support structure and the second support structure, and
   wherein the first maximum width is greater than the second maximum width.

2. The semiconductor device as claimed in claim 1, wherein:
   at least one of the support structures includes a lower region and an upper region,
   the lower region is a region in which a width of the at least one of the support structures increases from a lower end of the at least one of the support structures toward the upper region, and
   the upper region is a region in which the width of the at least one of the support structures increases from an upper end of the at least one of the support structures toward the lower region.

3. The semiconductor device as claimed in claim 1, wherein:
   the first maximum width and second maximum width are eater than a first upper width of the first supp port structure and a second upper width of the second support structure, respectively.

4. The semiconductor device as claimed in claim 1, further comprising upper interconnection members on the stack structure and the channel structures and extending in a second direction, perpendicular to the first direction, the upper interconnection members being electrically connected to the channel structures and electrically isolated from the support structures.

5. The semiconductor device as claimed in claim 1, wherein a number of the gate electrodes through which the first support structure passes in the first region is greater than a number of the gate electrodes through which the second support structure passes in the second region.

6. The semiconductor device as claimed in claim 1, wherein:
   the contact region further includes a third region,
   the second region is closer to the memory cell array region in the first direction than the third region is, and
   the support structures further include a third support structure penetrating through the stack structure in the third region.

7. The semiconductor device as claimed in claim 6, wherein the third support structure has a third maximum width, the second maximum width being greater than the third maximum width.

8. The semiconductor device as claimed in claim 7, wherein;
   the first maximum width is greater than the third maximum width by about 10% to about 25% of the third maximum width, and
   the second maximum width is greater than the third maximum width by about 2% to about 15% of the third maximum width.

9. The semiconductor device as claimed in claim 1, wherein upper ends of the separation structures are at levels higher than upper ends of the channel structures and higher than upper ends of the support structures.

10. The semiconductor device as claimed in claim 1, further comprising:
    through-interconnection regions including sacrificial layers alternately stacked with the interlayer insulating layers, the sacrificial layers being at same level as the gate electrodes in the contact region, and
    through-contact plugs passing through the sacrificial layers and electrically connected to the gate electrodes.

11. The semiconductor device as claimed in claim 10, wherein:
    the through-interconnection regions include a first through-interconnection region in the first region and a second through-interconnection region in the second region,
    the first support structure is between the first through-interconnection region and the separation structures adjacent to the first through-interconnection region, and the second support structure is between the second through-interconnection region and the separation structures adjacent to the second through-interconnection region.

12. The semiconductor device as claimed in claim 10, further comprising a peripheral circuit structure including a lower substrate below the substrate and circuit elements on the lower substrate, the through-contact plugs passing through the substrate, extending vertically, and being electrically connected to the circuit elements.

13. A semiconductor device, comprising:
a stack structure including gate electrodes and interlayer insulating layers alternately stacked on a substrate, the stack structure having a memory cell array region and a contact region adjacent to each other in a first direction, and the gate electrodes extending in the first direction and including pad portions;
channel structures passing through the stack structure in the memory cell array region, each of the channel structures including a channel layer; and
support structures passing through the pad portions of the gate electrodes in the contact region,
wherein the contact region includes a first region and a second region, the first region being closer to the memory cell array region in the first direction than the second region is,
wherein the support structures include first support structures penetrating through a first pad portion of the first region among the pad portions, and second support structures penetrating through a second pad portion of the second region among the pad portions, and
wherein a first distance between the first support structures adjacent to each other in the first direction is less than a second distance between the second support structures adjacent to each other in the first direction, and wherein the first distance and the second distance are measured at a level that is higher than a mid-level of an entire length of the first support structure and the second support structure.

14. The semiconductor device as claimed in claim 13, further comprising upper interconnection members on the stack structure and the channel structures, the upper interconnection members extending in a second direction, perpendicular to the first direction, and the upper interconnection members being electrically connected to the channel structures and electrically isolated from the support structures.

15. The semiconductor device as claimed in claim 13, wherein each of the support structures has a maximum width at a level lower than an upper end thereof.

16. The semiconductor device as claimed in claim 13, wherein each of the support structures has an elliptical or bar-shaped upper surface having a major axis and a minor axis.

17. The semiconductor device as claimed in claim 16, wherein:
at least one of the first support structures has a first width in a direction of the major axis, and
at least one of the second support structures has a second width in the direction of the major axis, the first width being greater than the second width.

18. The semiconductor device as claimed in claim 13, wherein the support structures have a structure different from a structure of the channel structures.

19. A data storage system, comprising:
a lower structure including a lower substrate and circuit elements on the lower substrate;
a semiconductor storage device including an upper structure on the lower structure, and an input/output pad electrically connected to the circuit elements; and
a controller electrically connected to the semiconductor storage device through the input/output pad and configured to control the semiconductor storage device,
wherein the upper structure includes:
a stack structure including gate electrodes and interlayer insulating layers alternately stacked on an upper substrate, the stack structure having a memory cell array region and a contact region, and the gate electrodes extending in a first direction;
channel structures passing through the stack structure in the memory cell array region, each of the channel structures including a channel layer;
separation structures passing through the stack structure and extending in the first direction;
upper interconnection members on the stack structure and the channel structures, electrically connected to the channel layer, and extending in a second direction, perpendicular to the first direction; and
support structures between the separation structures, penetrating through the stack structure in the contact region, and electrically isolated from the upper interconnection members,
wherein the contact region includes a first region and a second region, the first region being closer to the memory cell array region in the first direction than the second region is,
wherein the support structures include a first support structure penetrating through the stack structure in the first region and a second support structure penetrating through the stack structure in the second region,
wherein the first support structure has a first maximum width, the second support structure has a second maximum width, and the first maximum width and the second maximum width re at a level that is higher than a mid-level of an entire length of the first support structure and the second support structure, and
wherein the first maximum width is greater than the second maximum width.

20. The data storage system as claimed in claim 19, wherein, in the contact region, a number of the gate electrodes through which the first support structure passes is greater than a number of the gate electrodes through which the second support structure passes.

\* \* \* \* \*